(12) United States Patent
Oi et al.

(10) Patent No.: US 7,403,370 B2
(45) Date of Patent: Jul. 22, 2008

(54) CAPACITOR PARTS

(75) Inventors: Kiyoshi Oi, Nagano (JP); Noriyoshi Shimizu, Nagano (JP); Tomoo Yamasaki, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 294 days.

(21) Appl. No.: 11/164,614

(22) Filed: Nov. 30, 2005

(65) Prior Publication Data

US 2006/0197184 A1    Sep. 7, 2006

(30) Foreign Application Priority Data

Dec. 24, 2004    (JP)    ............................ 2004-374481

(51) Int. Cl.
*H01G 4/228*    (2006.01)
*H01G 4/236*    (2006.01)
*H01G 4/008*    (2006.01)

(52) U.S. Cl. ...................... 361/306.2; 361/303; 361/307

(58) Field of Classification Search ............. 361/306.2, 361/306.1, 301.2, 301.3, 301.4, 303, 307, 361/308.1, 532, 534–535
See application file for complete search history.

(56) References Cited

U.S. PATENT DOCUMENTS

| | | | | |
|---|---|---|---|---|
| 4,349,862 | A * | 9/1982 | Bajorek et al. | 361/762 |
| 6,266,227 | B1 * | 7/2001 | Konushi et al. | 361/306.1 |
| 6,426,250 | B1 * | 7/2002 | Lee et al. | 438/239 |
| 6,724,611 | B1 * | 4/2004 | Mosley | 361/306.3 |
| 7,079,371 | B2 * | 7/2006 | Yamasaki | 361/303 |

FOREIGN PATENT DOCUMENTS

| | | | |
|---|---|---|---|
| JP | 08293582 A | * | 11/1996 |
| JP | 11-068319 | | 3/1999 |
| JP | 2003-68923 | | 3/2003 |

* cited by examiner

*Primary Examiner*—Eric Thomas
(74) *Attorney, Agent, or Firm*—Kratz, Quintos & Hanson, LLP

(57) ABSTRACT

A capacitor parts of the present invention, includes a substrate, a plurality of capacitor elements arranged on the substrate and composed of a lower electrode, a dielectric layer, and an upper electrode respectively, a lower electrode rewiring layer formed over the plurality of capacitor elements and connected electrically to lower electrodes of the plurality of capacitor elements respectively to act as a common electrode, and an upper electrode rewiring layer formed over the plurality of capacitor elements and connected electrically to upper electrodes of the plurality of capacitor elements respectively to act as another common electrode, wherein the plurality of capacitor elements are connected electrically in parallel in a state of the capacitor parts, thus, the impedance is reduced in a wide high-frequency band by changing impedances among the plurality of capacitor elements.

10 Claims, 22 Drawing Sheets

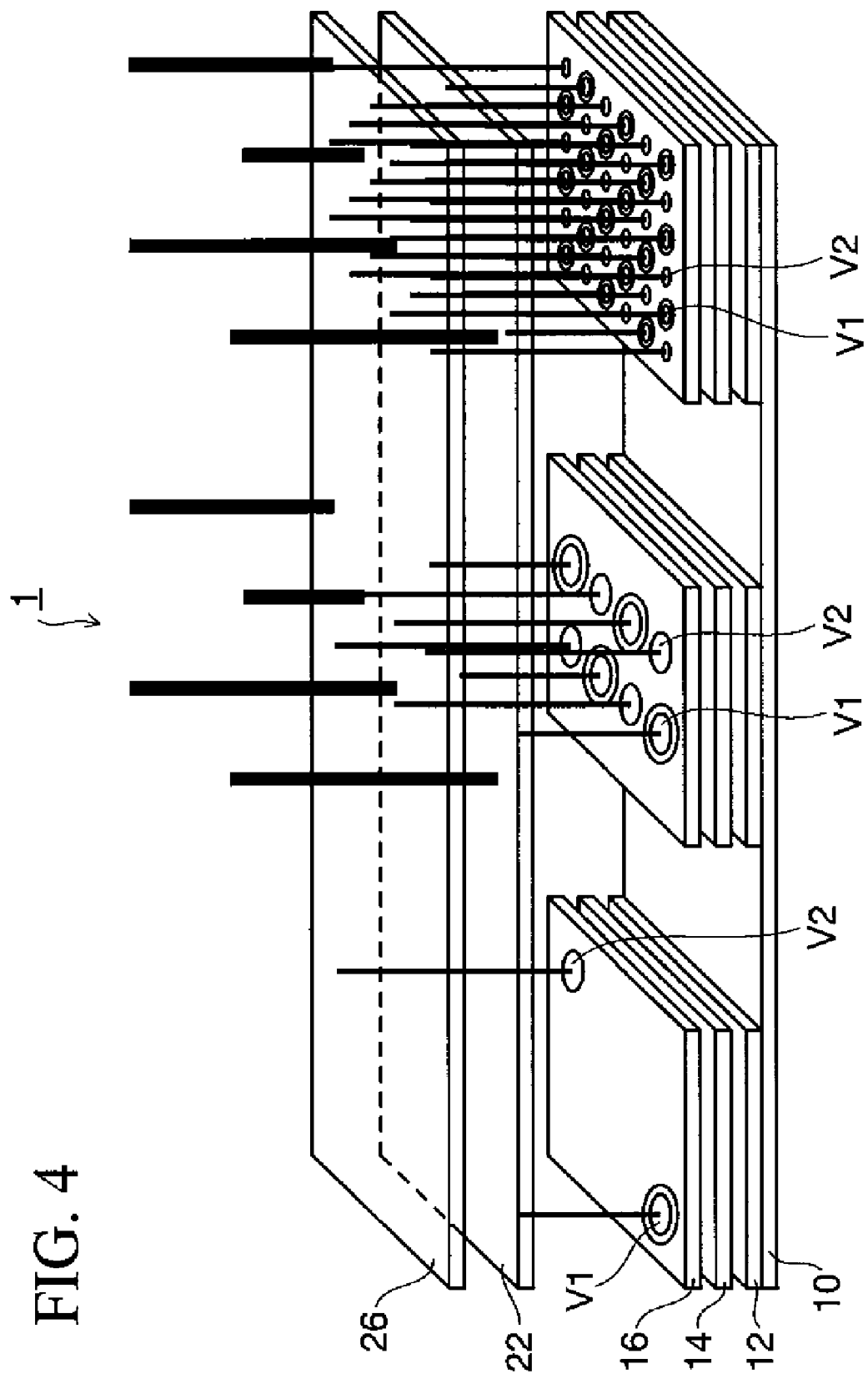

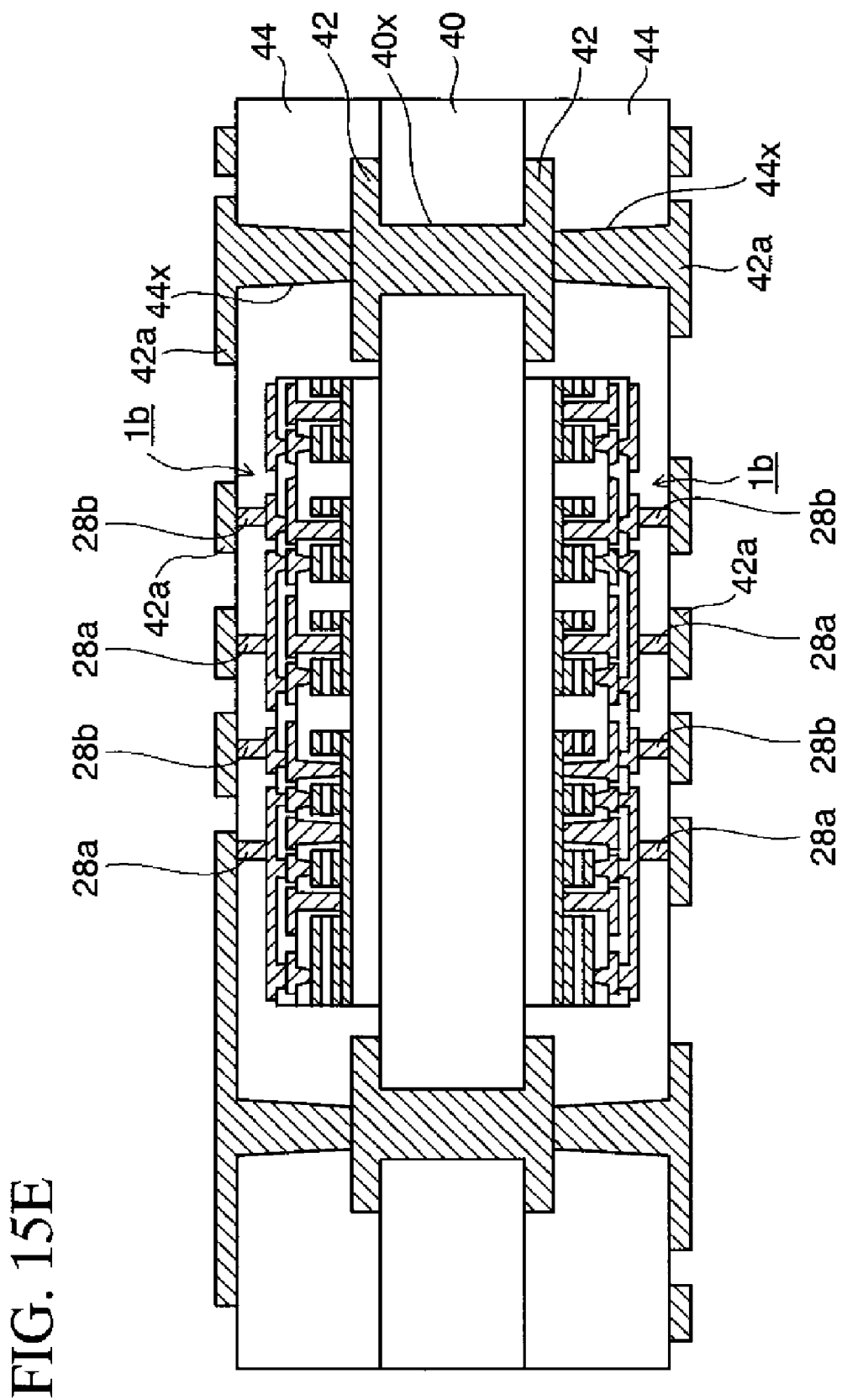

CAPACITOR PARTS

CROSS-REFERENCE TO RELATED APPLICATIONS

This application is based on and claims priority of Japanese Patent Application No. 2004-374481 filed on Dec. 24, 2004, the entire contents of which are incorporated herein by reference.

BACKGROUND OF THE INVENTION

1. Field of the Invention

The present invention relates to a capacitor parts and, more particularly, a capacitor parts applicable to a decoupling capacitor provided to a circuit substrate, on which high-speed semiconductor chip, etc. are mounted, to stabilize a power supply voltage and to reduce a high-frequency noise.

2. Description of the Related Art

In recent years, in the digital LSI typified in the microprocessor, a reduction in a power supply voltage made by an increase in a processing speed and a reduction in a consumption power is proceeding. In such digital LSI, the power supply voltage is prone to become unstable when the impedance of the LSI is varied abruptly, or the like. Also, since a stable operation in a further high frequency (GHz band) range is required of the high-speed digital LSI, it is needed to prevent the malfunction of LSI caused due to the high-frequency noise.

Therefore, for the purpose of stabilizing the power supply voltage and reducing the high-frequency noise, the decoupling capacitor is arranged between a power supply line and a ground line of the LSI in the circuit substrate.

As such decoupling capacitor, in Patent Literature 1 (Patent Application Publication (KOKAI) Hei 11-68319) and Patent Literature 2 (Patent Application Publication (KOKAI) 2003-68923), the method of forming the decoupling capacitor to be built in the multi-layered circuit substrate is set forth.

As the characteristic of the decoupling capacitor, the characteristic having a sufficiently low impedance in a wide high-frequency band is desired. However, since the capacitor parts has ESL (Equivalent Series Inductance), the impedance is increased in a frequency range that is higher than a resonance frequency as the frequency is increased. Thus, the high-frequency band in which the impedance is kept still low is narrowed.

As the measure against this defect, such an approach is taken that a plurality of capacitor parts each having a different impedance mutually are mounted onto the circuit substrate to be connected electrically in parallel, so that the impedance can be reduced in the wide high-frequency range by the synthesized impedance.

However, in case a plurality of capacitor parts are mounted onto the circuit substrate, the routing of leads is required between the LSI chip and the capacitor parts and thus relatively large parasitic inductances exist between these leads. Also, even though a wiring distance between the LSI chip and the decoupling capacitor is set shortest by arranging the decoupling capacitor immediately under the LSI chip, there is a limit to a reduction in the parasitic inductance, and thus it is extremely difficult to reduce the impedance in the wide high-frequency band (GHz band).

SUMMARY OF THE INVENTION

It is an object of the present invention to provide a capacitor parts that is applicable to a decoupling capacitor whose impedance in a wide high-frequency band (GHz band) can be reduced and which can deal with a further high frequency of semiconductor chip.

The present invention is concerned with a capacitor parts, which includes a substrate; a plurality of capacitor elements arranged on the substrate, and composed of a lower electrode, a dielectric layer, and an upper electrode respectively; a lower electrode rewiring layer formed over said plurality of capacitor elements, and connected electrically to lower electrodes of said plurality of capacitor elements respectively to act as a common electrode; and an upper electrode rewiring layer formed over said plurality of capacitor elements, and connected electrically to upper electrodes of said plurality of capacitor elements respectively to act as another common electrode; wherein said plurality of capacitor elements are connected electrically in parallel in a state of the capacitor parts.

The capacitor parts of the present invention is composed of a plurality of capacitor elements arranged on the substrate, and a plurality of capacitor elements are rewired in a parts state and connected electrically in parallel. Then, the impedance is slightly changed among a plurality of capacitor elements and these capacitor elements are connected electrically in parallel by the fine rewiring in a parts state. As the result, the parallel circuit having small inductance can be composed, and the capacitor parts having the small impedance over the wide high-frequency band (GHz band) can be obtained.

Accordingly, the capacitor parts of the present invention can give enough performance as the decoupling capacitor for the high-speed semiconductor chip. If the silicon substrate, for example, is employed as the substrate, the fine rewiring layer can be formed in its parts state by the high photolithography technology.

As the method of changing the impedance among a plurality of capacitor elements, the number of the connecting vias (electrode terminals) connected to the lower electrode and the upper electrode respectively is set differently among a plurality of capacitor elements mutually. In respective capacitor elements, a plurality of connecting vias (electrode terminals) are arranged such that electric polarities (+,−) are aligned alternately. Accordingly, since the inductance generated by a current along the direction of the electric field is canceled mutually in two sets (+,− constitute one set) of neighboring connecting vias (electrode terminals), the impedance of the capacitor elements can be reduced. In this manner, the capacitor elements having the different impedance mutually can be obtained by changing the number of the connecting vias (electrode terminals) among a plurality of capacitor elements.

Otherwise, the upper electrode and the lower electrode of the capacitor elements are divided into the partial electrodes, and then the number of electrode division may be set differently mutually among a plurality of capacitor elements. In the capacitor elements, the partial electrodes are divided such that the electric polarities (+,−) are aligned alternately and assigned to the partial electrodes. Therefore, since the electric field generated between the upper partial electrode and the lower partial electrode is directed in the opposite direction mutually in the neighboring partial electrodes each having the different polarity in one capacitor element, the impedance can be canceled mutually and thus the impedance of the capacitor elements can be reduced. In this manner, the capacitor elements having the different impedance mutually may be obtained by changing the number of electrode division among a plurality of capacitor elements.

BRIEF DESCRIPTION OF THE DRAWINGS

FIG. 1 is viewed from the top side;

FIG. 4 is a perspective view showing schematically a situation that a plurality of capacitor elements in the first capacitor parts of the embodiment of the present invention are connected electrically in parallel;

FIG. 6 is viewed from the top side;

FIGS. 9A and 9B are sectional views showing a method of forming a rewiring layer connected to a plurality of capacitor elements in the second capacitor parts of the embodiment of the present invention, wherein FIG. 9A is equivalent to a sectional broken view taken along a chain line II-II in FIG. 7;

FIGS. 15A to 15G are sectional views showing a method of mounting the capacitor parts of the embodiment of the present invention onto a circuit substrate.

DETAILED DESCRIPTION OF THE PREFERRED EMBODIMENTS

Embodiments of the present invention will be explained with reference to the accompanying drawings hereinafter.

(First Capacitor Parts)

Figure 1:
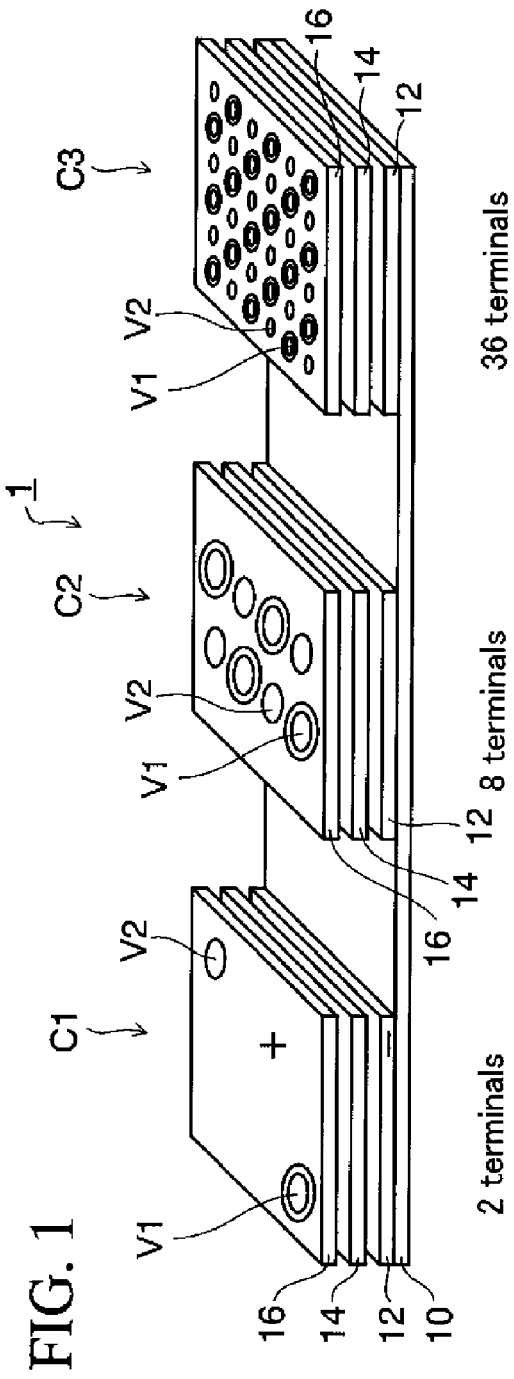
FIG. 1 is a perspective view showing schematically a first capacitor parts of an embodiment of the present invention.
Figure 2:
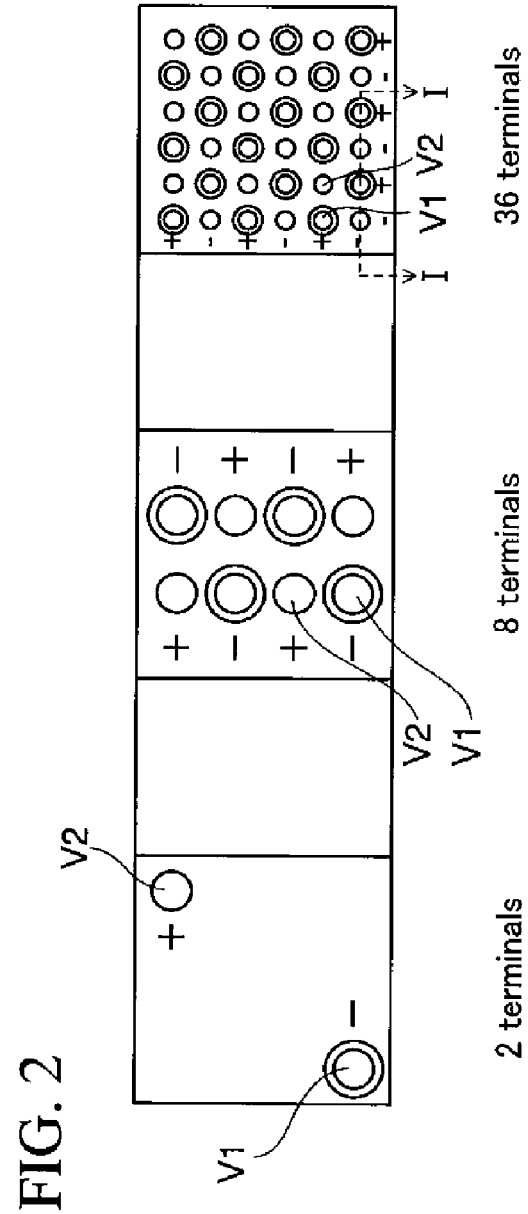
FIG. 2 is a plan view of the first capacitor parts when
Figure 3:
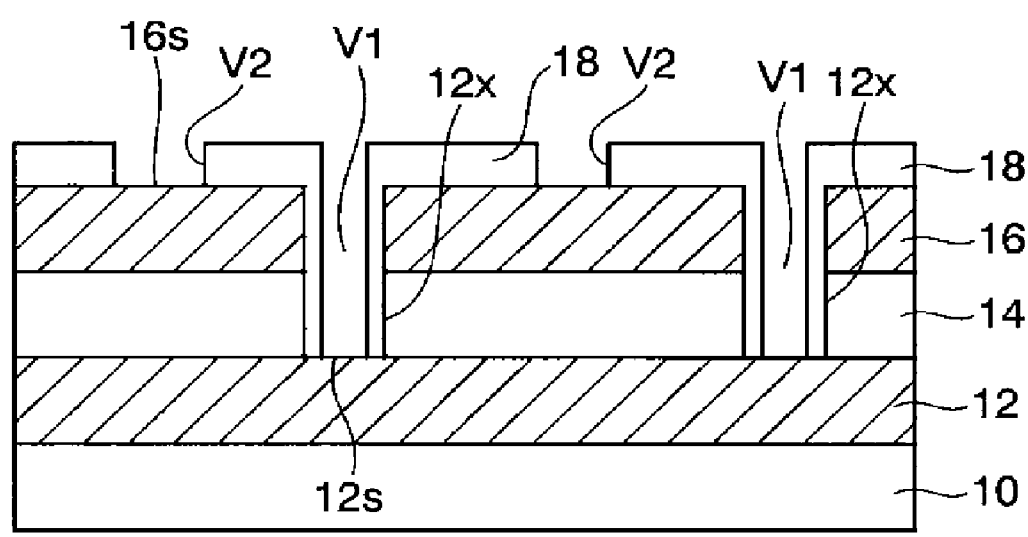
FIG. 3 is a sectional view showing a situation that connection vias are formed in a capacitor element in the first capacitor parts of the embodiment of the present invention, which is equivalent to a sectional view taken along a line I-I in FIG. 2.

FIG. 1 is a perspective view showing schematically a first capacitor parts of an embodiment of the present invention, FIG. 2 is a plan view of the first capacitor parts in FIG. 1, and FIG. 3 is a sectional view taken along a line I-I in FIG. 2.

A first capacitor parts of the present embodiment is composed of a plurality of capacitor elements. In FIG. 1 and FIG. 2, a first capacitor parts 1 constructed by arranging first to third capacitor elements C1, C2, C3 on a substrate 10 is exemplified. Each of the first to third capacitor elements C1, C2, C3 is composed of a lower electrode 12, a dielectric layer 14, and an upper electrode 16.

By referring to FIG. 3 further, in respective capacitor elements C1, C2, C3, opening portions 12x having a depth reaching a connection portion 12s of the lower electrode 12 are provided in the upper electrode 16 and the dielectric layer 14. A first insulating layer 18 is formed on side surfaces of the opening portions 12x, and lower electrode connecting vias V1 from which a bottom portion of the opening portion 12x is exposed respectively are formed. Also, the first insulating layer 18 is formed to extend over the upper electrode 16 from the side surface of the lower electrode connecting via V1. An upper electrode connecting via V2 is provided in portions of the first insulating layers 18 on connection portions 16s of the upper electrode 16. In this manner, the lower electrode connecting via V1 and the upper electrode connecting via V2 are formed in the capacitor elements C1, C2, C3 respectively. In this case, the first insulating layer 18 in FIG. 3 is omitted from the illustration of FIG. 1 and FIG. 2.

As shown in FIG. 1 and FIG. 2, the first capacitor element C1 is of 2-terminal type in which the lower electrode connecting via V1 and the upper electrode connecting via V2 are provided by one respectively. Also, the second capacitor element C2 is of 8-terminal type in which the lower electrode connecting via V1 and the upper electrode connecting via V2 are provided by four respectively. In addition, the third capacitor element C3 is of 36-terminal type in which the lower electrode connecting via V1 and the upper electrode connecting via V2 are provided by eighteen respectively. Then, electrode terminals (wiring layers) connected to the lower electrode 12 and the upper electrode 16 are provided to the lower electrode connecting via V1 and the upper electrode connecting via V2 respectively. In this manner, in the first capacitor parts 1 in the present embodiment, respective numbers of the lower electrode connecting via V1 (electrode terminal) and the upper electrode connecting via V2 (electrode terminal) are different among the capacitor elements C1, C2, C3.

For example, the electrode terminal provided in the upper electrode connecting via V2 is assigned to the plus (+) polarity, and the electrode terminal provided in the lower electrode connecting via V1 is assigned to the minus (−) polarity. When a voltage signal of a predetermined magnitude is applied to respective electrode terminals of a plurality of upper electrode connecting vias V2 (+) and lower electrode connecting vias V1 (−) whose electric polarities are arranged alternately, inductances generated by a current, which flows in the direction of the electric field corresponding to one set of electrode terminals, and inductances generated by a current, which flows in the direction of the electric field corresponding to the other set of electrode terminals, are canceled mutually in neighboring two sets of electrode terminals (one set consists of +, −) that have the different polarity respectively. As a result, the mutual inductance can be canceled and thus the impedance of the capacitor parts can be reduced. Also, the impedance of the capacitor element has a tendency to reduce as the number of two sets of connecting vias (electrode terminals) having the different polarity respectively is increased.

In this manner, in the capacitor parts 1 of the present embodiment, the impedances are made different among a plurality of capacitor elements C1, C2, C3 by changing the number of the upper electrode connecting vias V2 and the lower electrode connecting vias V1 among a plurality of capacitor elements C1, C2, C3.

Next, one of technical ideas of the capacitor parts of the present invention resided in that, as shown in FIG. 4, respective lower electrodes 12 of a plurality of capacitor elements C1, C2, C3 whose the numbers of connecting vias (electrode terminals) are different mutually are connected to a lower electrode rewiring layer 22 acting as a common electrode via the lower electrode connecting via V1, and respective upper electrodes 16 of a plurality of capacitor elements C1, C2, C3 are connected to a upper electrode rewiring layer 26 acting as a common electrode via the upper electrode connecting via V2,thus the first to third capacitor elements C1, C2, C3 are connected electrically in parallel.

Figure 5A:
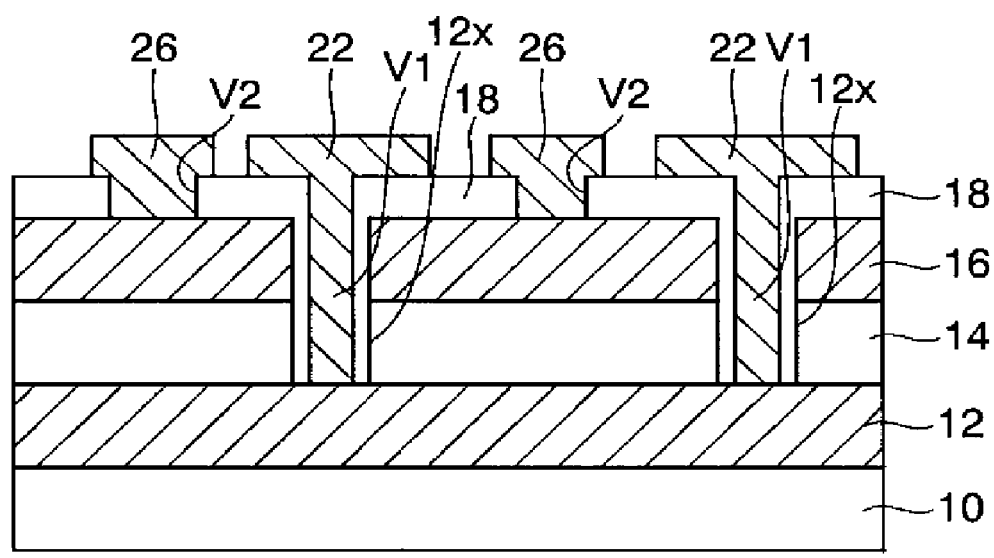
FIGS. 5A and 5B are sectional views showing a method of forming a rewiring layer connected to a plurality of capacitor elements in the first capacitor parts of the embodiment of the present invention.

More particularly, as shown in FIG. 5A, first, the first lower electrode rewiring layer 22 connected to the lower electrode 12 via the lower electrode connecting via V1 are formed on the first insulating layer 18. This first lower electrode rewiring layer 22 is rewired as the common electrode that is connected to respective lower electrodes 12 of the first to third capacitor elements C1, C2, C3. Also, the first upper electrode rewiring layer 26 connected to respective upper electrodes 16 of the first to third capacitor elements C1, C2, C3 individually is formed on the first insulating layer 18.

Figure 5B:
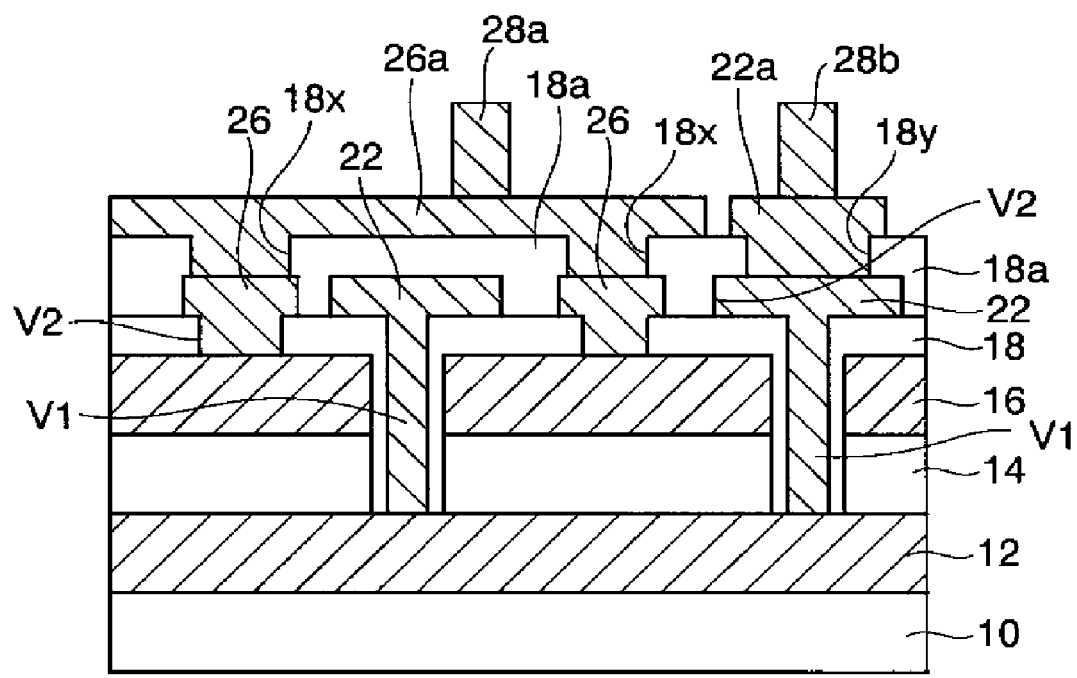

Then, as shown in FIG. 5B, a second insulating layer 18a in which an opening portion 18x is provided on the first upper electrode rewiring layer 26 and the connection portion of the first lower electrode rewiring layer 22 is formed. Then, a second upper electrode rewiring layer 26a, which is connected to the first upper electrode rewiring layer 26 via the opening portion 18x in the second insulating layer 18a to constitute a second-layer wiring, and a second lower electrode rewiring layer 22a, which is connected to the first lower electrode rewiring layer 22 to constitute the second-layer wiring, are formed on the second insulating layer 18a.

The second upper electrode rewiring layer 26a is formed as the common electrode that is connected to respective upper electrodes 16 of a plurality of capacitor elements C1, C2, C3 via the first upper electrode rewiring layer 26. Also, a upper electrode external connection terminal 28a and a lower electrode external connection terminal 28b are provided to the second upper electrode rewiring layer 26a and the second lower electrode rewiring layer 22a respectively to protrude therefrom.

As described above, in the capacitor parts 1 of the present embodiment, the impedance is made different mutually in a plurality of capacitor elements, by changing the numbers of the upper electrode connecting via V2 (electrode terminal) and the lower electrode connecting via V1 (electrode terminal) among a plurality of capacitor elements C1, C2, C3.

Also, in the capacitor parts 1 of the present embodiment, since a plurality of capacitor elements are formed on the substrate 10 (silicon wafer, glass, or the like) and then a plurality of capacitor elements are connected electrically in parallel by forming the fine rewiring layer in its parts condition, the capacitor parts having the small inductance can be obtained. In addition, since the impedance is changed among a plurality of capacitor elements by using multiple terminals, the impedance can be changed finely among respective capacitor elements connected in parallel, and thus their synthesized impedance can be lowered in a wide high-frequency band (GHz band).

Accordingly, the capacitor parts 1 of the present embodiment can give enough performance as the decoupling capacitor for the high-speed electronic parts.

Here, in the above embodiment, the capacitor parts composed of three capacitor elements is exemplified. But it is needless to say that the number of the capacitor elements and the number of the connecting vias (electrode terminals) provided to respective capacitor elements can be set arbitrarily.

(Second Capacitor Parts)

Figure 6:
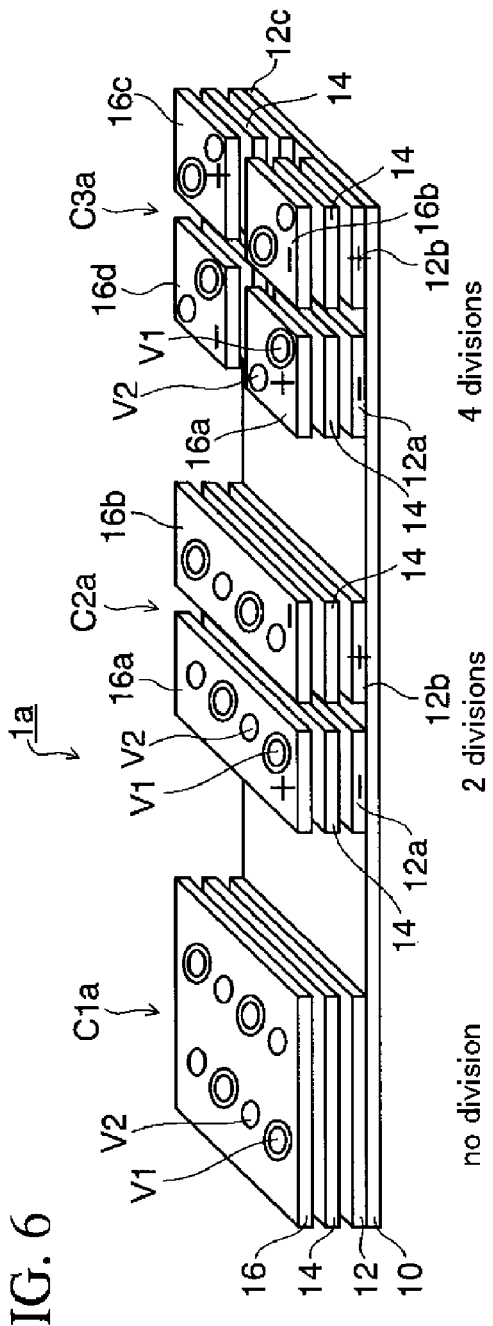
FIG. 6 is a perspective view showing schematically a second capacitor parts of an embodiment of the present invention.
Figure 7:
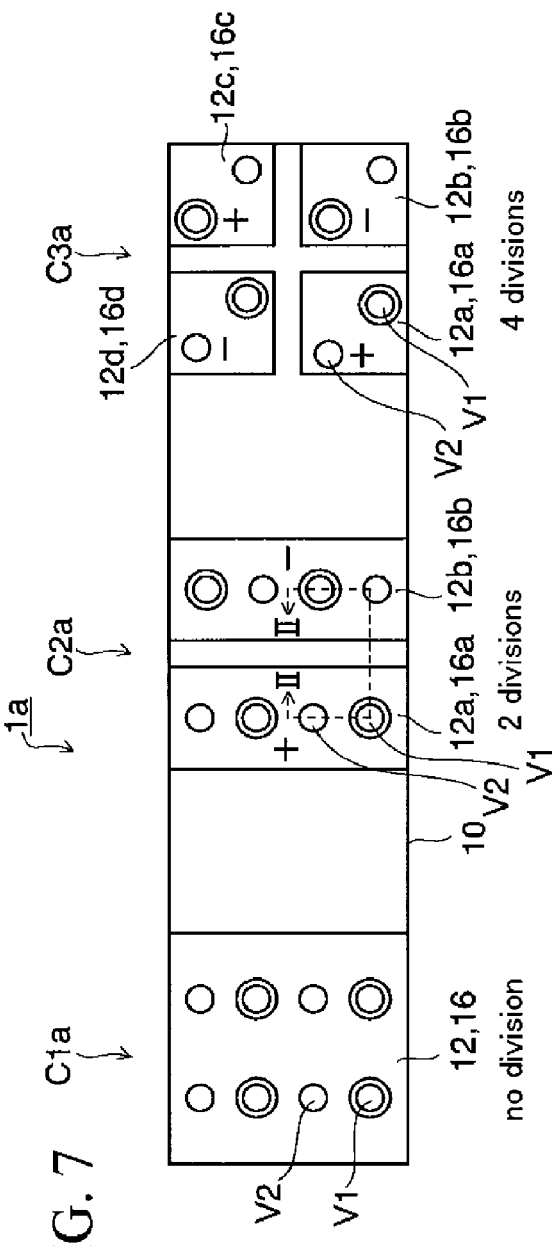
FIG. 7 is a plan view of the second capacitor parts when

FIG. 6 is a perspective view showing schematically a second capacitor parts of the embodiment of the present invention, and FIG. 7 is a plan view of the second capacitor parts in FIG. 6. A difference of the second capacitor parts from the first capacitor parts resides in that the electrodes are divided such that the number of respective electrodes is different among a plurality of the capacitor elements in the capacitor parts. In the second capacitor parts, the same reference symbols are affixed to the same elements as the first capacitor parts, and their explanation will be omitted herein.

As shown in FIG. 6 and FIG. 7, like the above first capacitor parts, a second capacitor parts 1a of the present embodiment is constructed by arranging a plurality of capacitor elements C1a, C2a, C3a on the substrate 10. In the first capacitor element C1a, the lower electrode 12 and the upper electrode 16 are not divided, and the upper electrode connecting via V2 and the lower electrode connecting via V1, which have the similar structures to the capacitor elements of the first capacitor parts, are provided by four individually.

In the second capacitor element C2a, the lower electrode and the upper electrode are divided into two lower partial electrodes 12a, 12b and two upper partial electrodes 16a, 16b respectively, and divided partial electrodes are assigned such that the electric polarities (+,−) are aligned mutually. The upper electrode connecting via V2 and the lower electrode connecting via V1 are provided to two lower partial electrodes 12a, 12b and two upper partial electrodes 16a, 16b by two respectively.

Also, in the third capacitor element C3a, the lower electrode and the upper electrode are divided into four lower partial electrodes 12a to 12d and four upper partial electrodes 16a to 16d respectively, and divided partial electrodes are assigned such that the electric polarities (+,−) are aligned mutually. The upper electrode connecting via V2 and the lower electrode connecting via V1 are provided to four lower partial electrodes 12a to 12d and four upper partial electrodes 16a to 16d by one respectively.

Figure 8:
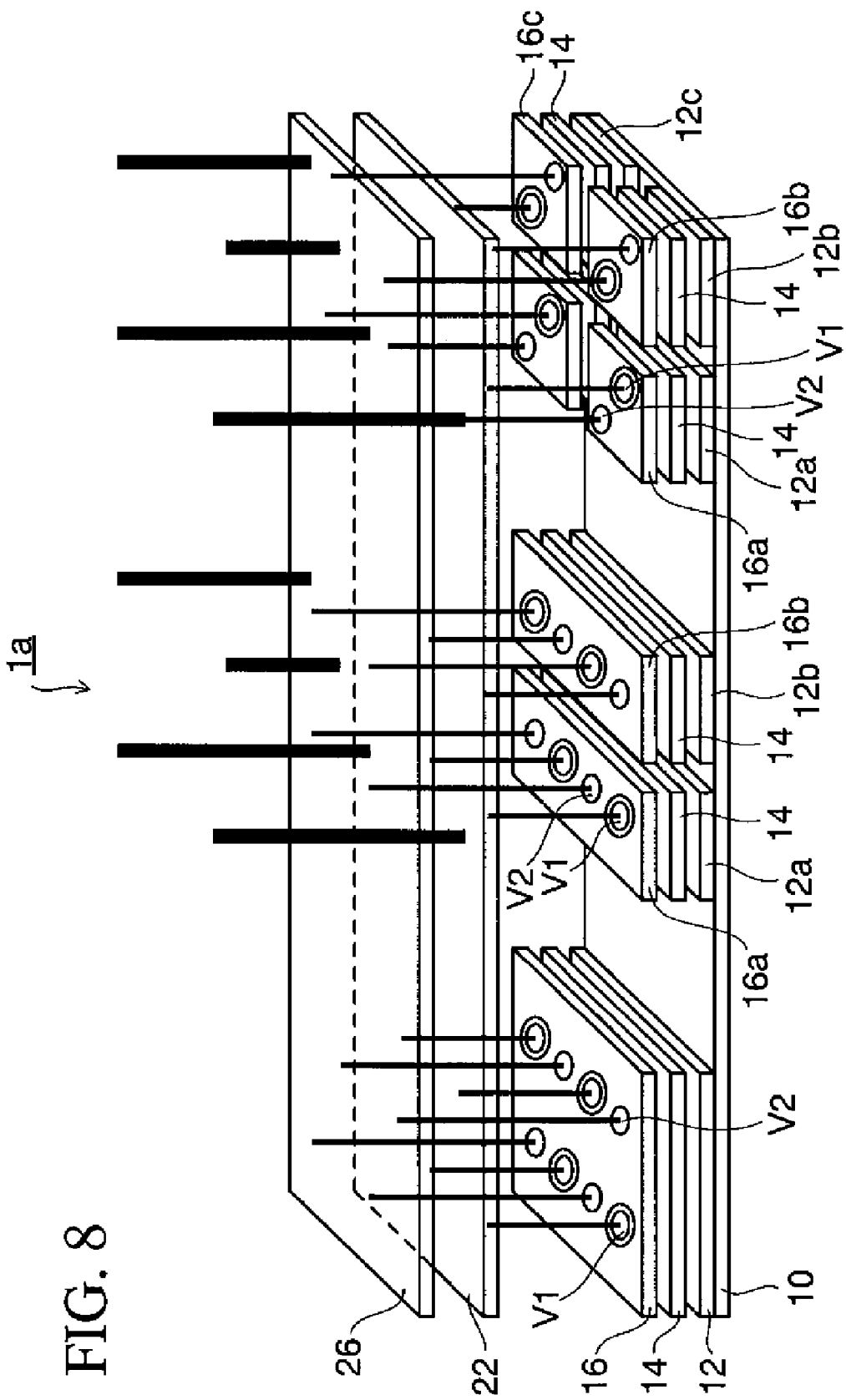
FIG. 8 is a perspective view showing schematically a situation that a plurality of capacitor elements in the second capacitor parts of the embodiment of the present invention are connected electrically in parallel.

Then, as shown in FIG. 8, like the technical idea of the first capacitor parts 1, in the second capacitor parts 1a, first, the lower electrode 12 and the lower partial electrodes 12a to 12d of a plurality of capacitor elements C1a, C2a, C3a, the number of the electrode division of which is different mutually, are connected to the first lower electrode rewiring layer 22 acting as the common electrode via the lower electrode connecting via V1. Also, the upper electrode 16 and the upper partial electrodes 16a to 16d of a plurality of capacitor elements C1a, C2a, C3a are connected to the first upper electrode rewiring layer 26 acting as the common electrode via the upper electrode connecting via V2. Accordingly, the first to third capacitor elements C1a, C2a, C3a are connected electrically in parallel.

Figure 9A:
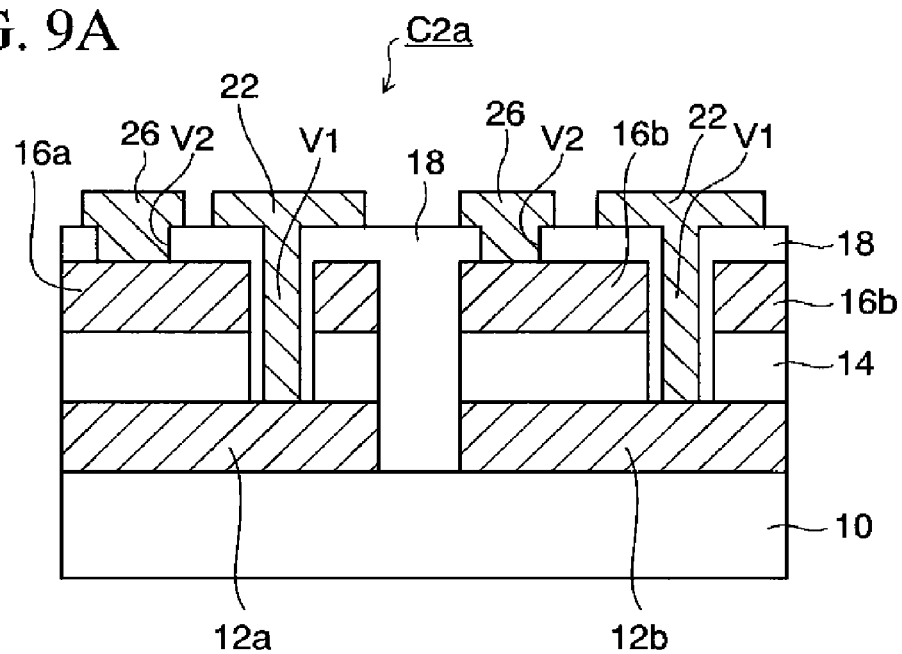

A situation that the first to third capacitor elements C1a, C2a, C3a are rewired and connected electrically in parallel will be explained with reference to a sectional broken view (FIG. 9A) taken along a chain line II-II in the second capacitor element C2a in FIG. 7. More particularly, as shown in FIG. 9A, in the second capacitor element C2a, the lower electrode and the upper electrode are divided into two lower partial electrodes 12a, 12b and two upper partial electrodes 16a, 16b respectively, and the lower electrode connecting via V1 and the upper electrode connecting via V2 having the same configuration as the first capacitor parts 1 are provided. Also, the first lower electrode rewiring layer 22 connected to two lower partial electrodes 12a, 12b via the lower electrode connecting via V1 respectively is formed on the first insulating layer 18. This first lower electrode rewiring layer 22 is rewired as the common electrode that is connected to the lower electrode 12 and the lower partial electrodes 12a to 12d of the first to third capacitor elements C1a, C2a, C3a respectively. Also, the first upper electrode rewiring layer 26 connected individually to the upper partial electrodes 16a, 16b via the upper electrode connecting via V2 is formed on the first insulating layer 18.

Figure 9B:
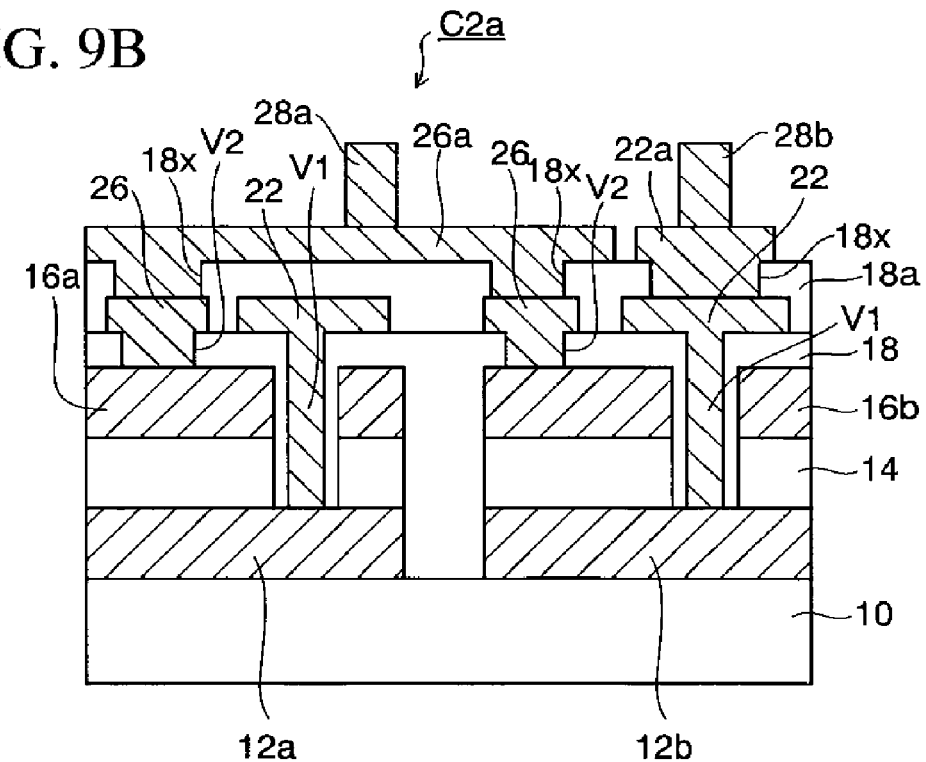

Then, as shown in FIG. 9B, the second insulating layer 18a in which the opening portion is provided on respective connection portions of the first upper electrode rewiring layer 26 and the first lower electrode rewiring layer 22 is formed. Then, the second upper electrode rewiring layer 26a, which is connected to the first upper electrode rewiring layer 26 via the opening portion 18x in the second insulating layer 18a, and the second lower electrode rewiring layer 22a, which is connected to the first lower electrode rewiring layer 22, are formed on the second insulating layer 18a. The second upper electrode rewiring layer 26a is formed as the common electrode of the upper electrode 16 and the upper partial electrodes 16a to 16d of a plurality of capacitor elements C1a, C2a, C3a. Also, the upper electrode external connection terminal 28a and the lower electrode external connection terminal 28b are provided to the second upper electrode rewiring layer 26a and the second lower electrode rewiring layer 22a respectively to protrude therefrom.

In this manner, the second capacitor parts 1a of the present embodiment is constructed in such a manner that the upper electrode and the lower electrode of the capacitor elements C1a, C2a, C3a are divided and their partial electrodes are connected electrically by the rewiring layer.

In respective capacitor elements C1a, C2a, C3a of the second capacitor parts 1a, as shown in FIG. 7, since the respective partial electrodes whose upper and lower electrodes constitute a set of electrodes are arranged such that the electric polarities are aligned alternately, the electric fields generated between the upper and lower electrodes are directed to the opposite direction mutually between the partial electrodes which are arranged to be neighboring. Therefore, the inductances generated by the current, which flows in the direction of the electric field between one upper and lower partial electrodes, and the inductances generated by the current, which flows in the direction of the electric field between the other upper and lower partial electrodes, are canceled mutually. Also, the impedance of the capacitor element has a tendency to reduce as the number of the electrode divisions is increased.

In this manner, in the second capacitor parts 1a of the present embodiment, the impedances are made different mutually among a plurality of capacitor elements by changing the number of the electrode divisions among a plurality of capacitor elements C1a, C2a, C3a. Also, the capacitor elements C1a, C2a, C3a are connected electrically in parallel by forming the fine rewiring layer in the capacitor parts 1a. Therefore, like the first capacitor parts 1, in the second capacitor parts 1a, the impedance is slightly different among the capacitor elements C1a, C2a, C3a and also the impedance is lowered, so that the impedance can be lowered in a wide high-frequency band (GHz band) and the second capacitor parts 1a can give enough performance as the decoupling capacitor.

Here, in the second capacitor parts 1a, the capacitor parts constructed by three capacitor elements C1a, C2a, C3a is exemplified. But it is needless to say that the number of the capacitor elements and the number of the electrode divisions can be set arbitrarily.

Figure 10:
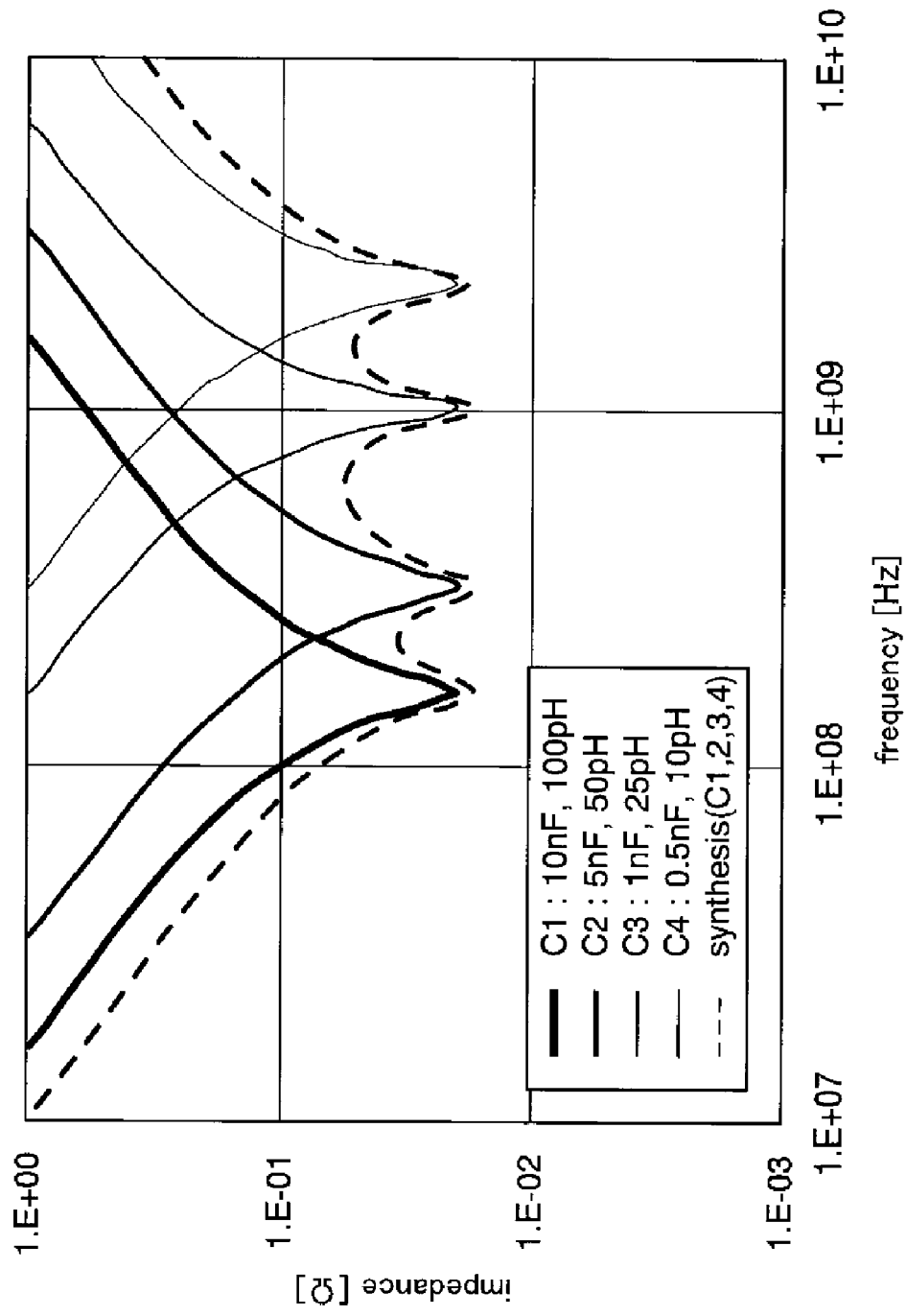
FIG. 10 is a graph showing an impedance characteristic of the capacitor parts of the embodiment of the present invention.

FIG. 10 shows a simulation of the impedance characteristic of the capacitor parts of the present embodiment. As the capacitor parts, such a capacitor parts was employed that four capacitor elements whose impedances are slightly different are connected in parallel. In FIG. 10, characteristics indicated by solid lines are individual impedance characteristics of four capacitor elements C1, C2, C3, C4. An electrostatic capacity of four capacitor elements C1, C2, C3, C4 is set to 10 nF, 5 nF, 1 nF, 0.5 nF respectively, and ESL (equivalent series inductance) is set to 100 pH, 50 pH, 25 pH, 10 pH respectively.

As shown in FIG. 10, in respective capacitor elements C1, C2, C3, C4, it is appreciated that their resonance frequencies are shifted mutually by changing slightly the impedance. Here, the impedance characteristic of the capacitor parts $C_{1,2,3,4}$ of the present embodiment constructed by connecting four capacitor elements C1, C2, C3, C4 in parallel is indicated by a broken line, and the impedance is reduced in the wide high-frequency band (100 MHz to several GHz) by changing the impedances of the capacitor elements C1, C2, C3, C4.

The reason for this is given as that, as described above, in the present embodiment, a plurality of capacitor elements having the different impedance are formed on the substrate (silicon wafer, glass, or the like) by using the multiple terminals or the electrode division and then a plurality of capacitor elements are connected in parallel by forming the fine rewiring layer on the substrate. Therefore, the capacitor parts, the impedance of which is slightly different and the inductance of which is very small, can be obtained.

Unlike the present embodiment, according to a method of surface-mounting a plurality of capacitor parts having the different impedance on the circuit substrate and then connecting electrically a plurality of capacitor parts in parallel by the wiring step of the circuit substrate, the inductance of the wirings of the circuit substrate or a single body of the capacitor parts is large and thus it is impossible to reduce the inductance to several tens pH, or less. That is, it is difficult for the capacitor parts mounted by such method (comparative example) to reduce the impedance in the wide high-frequency band (GHz band).

Figure 11:
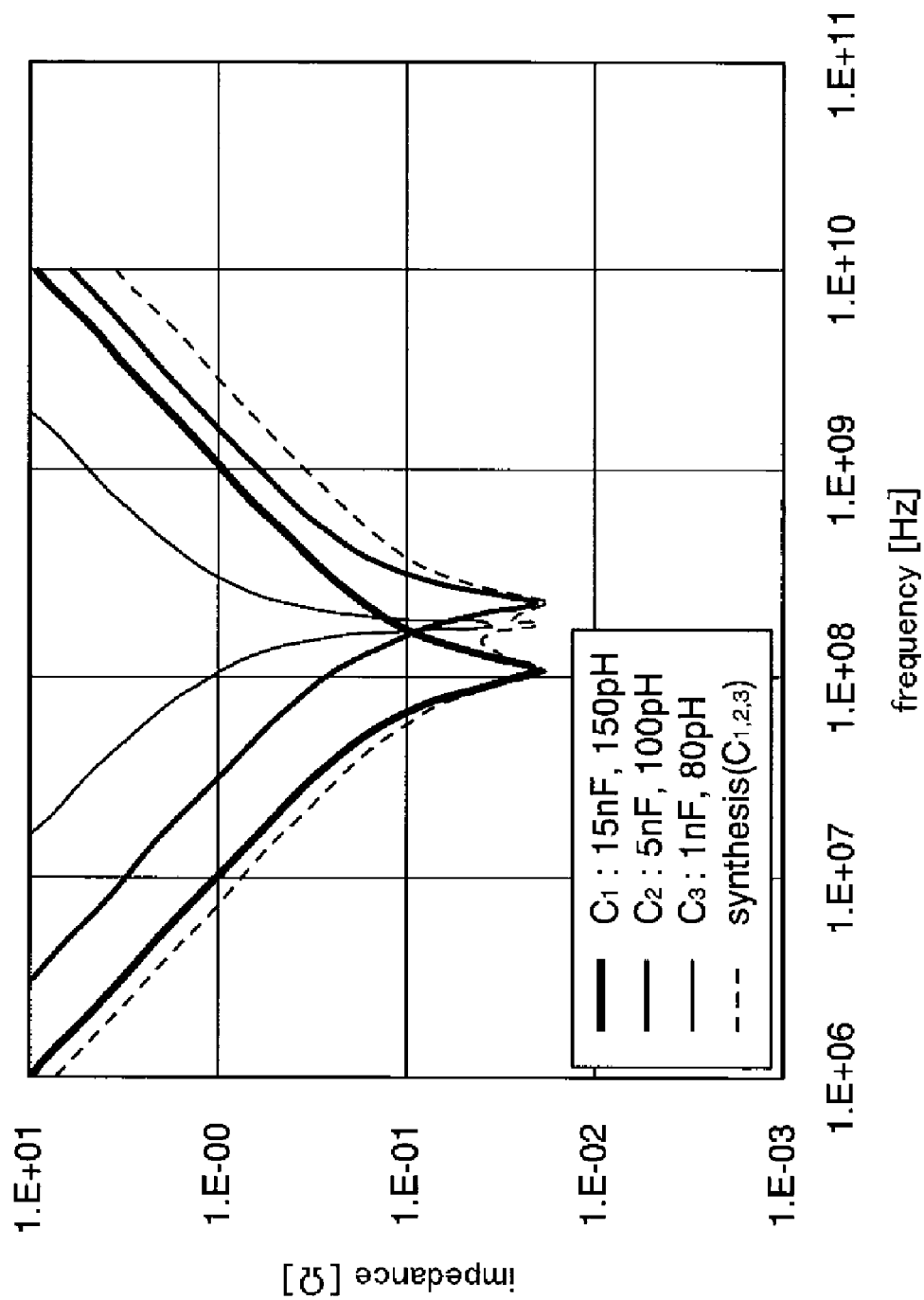
FIG. 11 is a graph (#1) showing an impedance characteristic of the capacitor parts of the comparative example.

In FIG. 11, impedance characteristics of the capacitor parts in the comparative example are shown. Individual impedance characteristics (solid lines) of three capacitor parts $C_1, C_2, C_3$ and a synthesized impedance characteristic (broken line) of three capacitor parts are shown. The electrostatic capacity of three capacitor elements C1, C2, C3 is set to 15 nF, 5 nF, 1 nF respectively, and ESL is set to 150 pH, 100 pH, 80 pH respectively.

As shown in FIG. 11, according to a method in the comparative example, it is impossible to reduce the impedance in the wide high-frequency band from 100 MHz to several GHz, and it is possible to reduce the impedance only at the frequency around several hundreds MHz. From this comparative example, it is understood that the technical idea of the present invention is effective.

Figure 12:
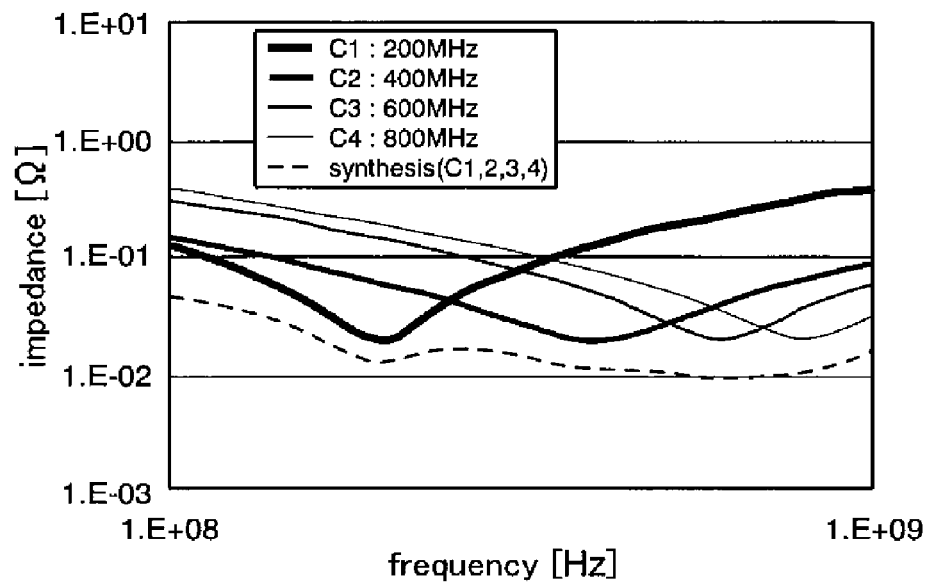
FIG. 12 is a graph showing a preferable example of a setting of a resonance frequency of respective capacitor elements in the capacitor parts of the embodiment of the present invention.

FIG. 12 shows a preferable example of a setting of the resonance frequency of respective capacitor elements in the capacitor parts of the present embodiment. The inventors of this application have studied that when how many resonance frequency of the capacitor elements of the capacitor parts should be shifted, whether the synthesized impedance is reduced in a flat state, in the case that the high-frequency band is ranged from 100 MHz to 1 GHz.

In FIG. 12, impedance characteristics of respective capacitor elements C1, C2, C3, C4 are indicated by a solid line and the synthesized impedance is indicated by a broken line. Ideally speaking, the resonance frequencies of a plurality of capacitor elements should be deviated infinitely finely. But the synthesized impedance becomes flat when a plurality of capacitor elements having the resonance frequency are connected in parallel every about 200 MHz. That is, when the resonance frequency of the capacitor elements C1, C2, C3, C4 is set to 200 MHz, 400 MHz, 600 MHz, 800 MHz respectively in the case that the high-frequency band is ranged from 100 MHz to 1 GHz, the synthesized impedance can be reduced in its flat state.

Although the values of the electrostatic capacities and the inductances of respective capacitor elements must be considered, the synthesized impedance can be reduced small and made flat in the wide high-frequency band if the resonance frequencies of a plurality of capacitor elements are set while shifting the frequency by about 20% of the used high-frequency (200 MHz in the case of 1 GHz).

Figure 13:
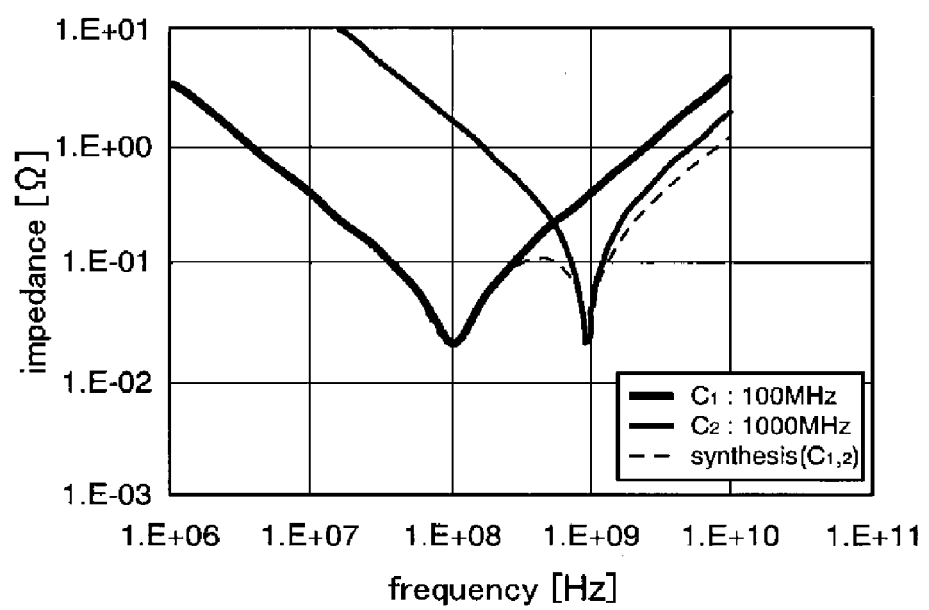
FIG. 13 is a graph (#2) showing an impedance characteristic of the capacitor parts of the comparative example.

In contrast, as shown in FIG. 13, in the case that two capacitor elements $C_1$, $C_2$ having the resonance frequency at 100 MHz and 1 GHz respectively are connected in parallel, the secondary resonance is generated and thus the band in which their synthesized impedance is increased is present within the frequency band between 100 MHz and 1 GHz. As a result, the effect of the decoupling capacitor cannot be sufficiently achieved.

Method of Manufacturing the Capacitor Parts in the Present Embodiment

Next, a method of manufacturing the capacitor parts of the embodiment of the present invention will be explained hereunder. FIGS. 14A to 14M are sectional views showing a method of manufacturing the capacitor parts of the embodiment of the present invention. In the present embodiment, a method of manufacturing the capacitor parts in which the capacitor elements in which the multiple terminals are provided and the capacitor elements in which the electrode division is applied are mixed together in arrangement on the substrate and connected in parallel will be explained hereunder.

Figure 14A:
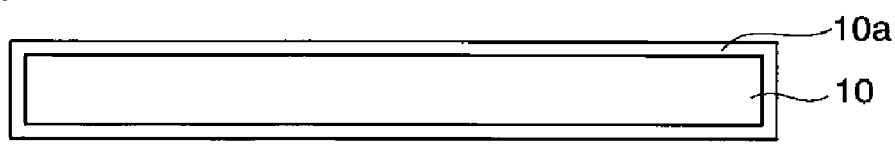
FIGS. 14A to 14M are sectional views showing a method of manufacturing the capacitor parts of the embodiment of the present invention.
Figure 14B:
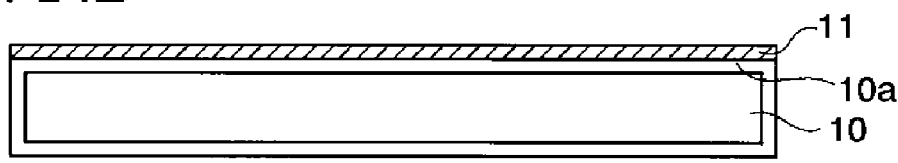

As shown in FIG. 14A, first the silicon substrate (silicon wafer) 10 whose outer layer portion is covered with a silicon oxide layer 10a is prepared as a preferable example of the substrate. Alternately the glass substrate may be used as the substrate, and in that case there is no need to form an insulating layer on the outer surface. Then, as shown in FIG. 14B, a conductive layer 11 to constitute the lower electrode of the capacitor is formed by forming a copper (Cu) layer on the silicon oxide layer 10a of the silicon substrate 10 by means of the electroplating or the sputter method.

Figure 14C:
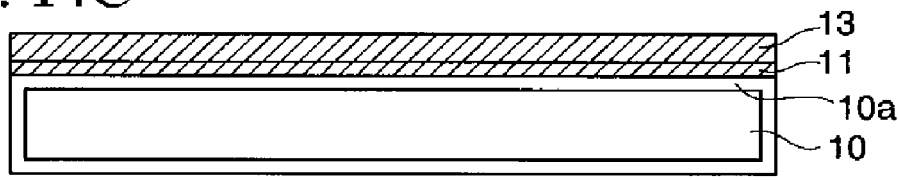
Figure 14D:
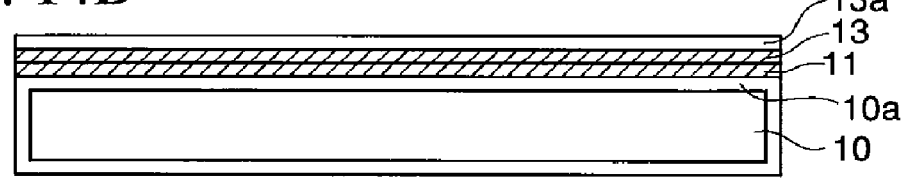

Then, as shown in FIG. 14C, a tantalum layer 13 of 600 nm thickness, for example, is formed on the conductive layer 11 by the sputter method. Then, as shown in FIG. 14D, a tantalum oxide layer 13a whose thickness is 50 to 300 nm is formed on a surface portion of the tantalum layer 13 by anodic-oxidizing the tantalum layer 13.

Figure 14E:
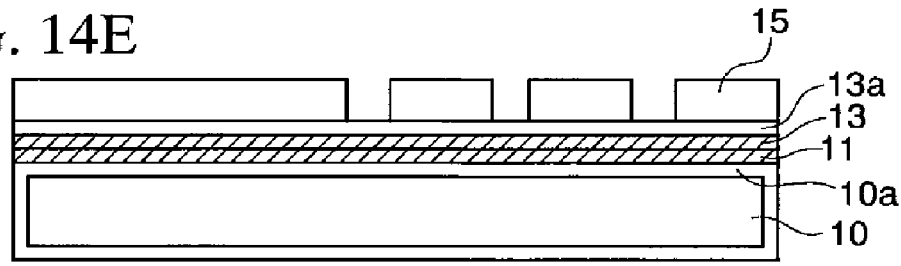
Figure 14F:
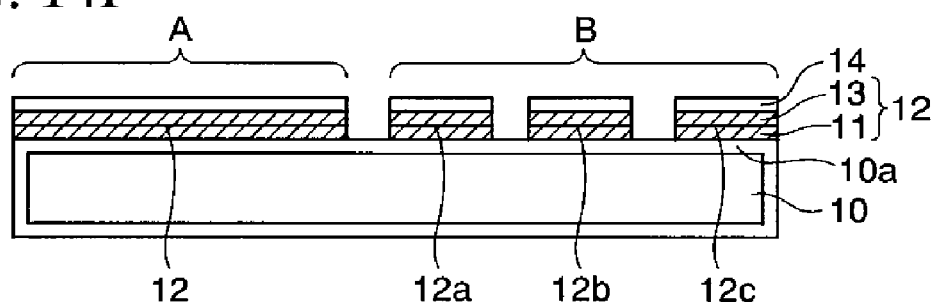

Then, as shown in FIG. 14E, a resist film 15 used to define the lower electrode is patterned on the tantalum oxide layer 13a. Then, the tantalum oxide layer 13a, the tantalum layer 13, and the conductive layer 11 are etched by the dry etching or the wet etching while using the resist film 15 as a mask. Then, the resist film 15 is removed. Accordingly, as shown in FIG. 14F, the lower electrode 12 is composed of the tantalum layer 13 and the conductive layer 11, and then the tantalum oxide layer 13a is patterned thereon, whereby the capacitor dielectric layer 14 is formed. At this time, the lower electrode 12 is formed by one pattern in a multi-terminal area A where the capacitor elements in which the multiple terminals are provided, and the lower electrode 12 is divided into three lower partial electrodes 12a to 12c in an electrode division area B where the electrode division is applied.

In the above example, the tantalum oxide layer 13a obtained by anodic-oxidizing the tantalum layer 13 is used as the dielectric layer 14. But the metal oxide layer such as BST ((Ba,Sr)TiO$_3$), STO (SrTiO$_3$), PZT (Pb(Zr,Ti)O$_3$), BTO (BaTiO$_3$), AlOx (alumina), SiOx (silicon oxide), NbOx (niobium oxide), TiOx (titanium oxide), or the like, or the resin containing their metal oxide filler may be employed. These dielectric layers are formed by the sputter method, the MOCVD (Metal Organic CVD) method, the sol-gel method, or the like.

Also, as the material of the lower electrode 12, chromium (Cr), platinum (Pt), gold (Au), tungsten (W), ruthenium (Ru), nickel (Ni), or the like may be employed in addition to a copper (Cu) or a tantalum (Ta). Also, the lower electrode 12 may be formed of a single-layer metal film, or a stacked metal film made of a combination of these metal materials.

Figure 14G:
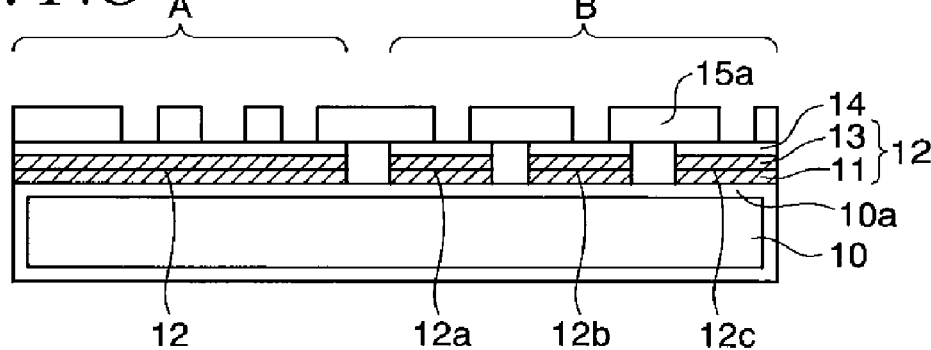

Then, as shown in FIG. 14G, a resist film 15a in which opening portions used to form the lower electrode connecting via are provided is formed on the dielectric layer 14. Then, the dielectric layer 14 and the tantalum layer 13 are etched by using the resist film 15a as a mask. Then, the resist film 15a is removed. Accordingly, as shown in FIG. 14H, a plurality of opening portions 14x having a depth that reaches the conductive layer 11 of the lower electrode 12 are formed in the multi-terminal area A, while opening portions 14y having a depth that reaches the conductive layer 11 of the lower partial electrodes 12a to 12c respectively are formed in the electrode division area B.

Figure 14H:
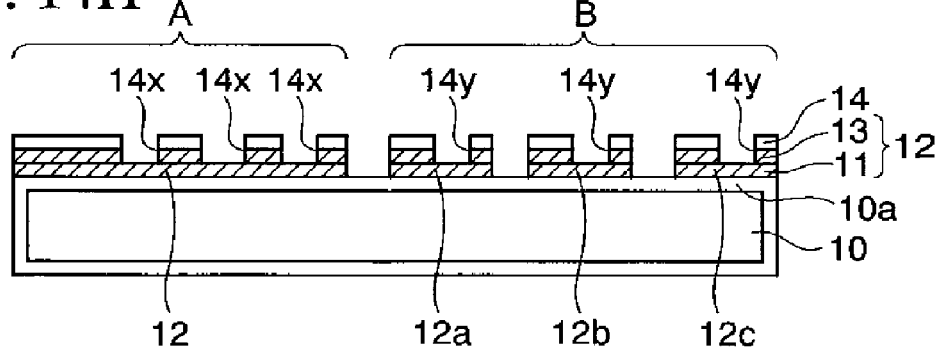
Figure 14I:
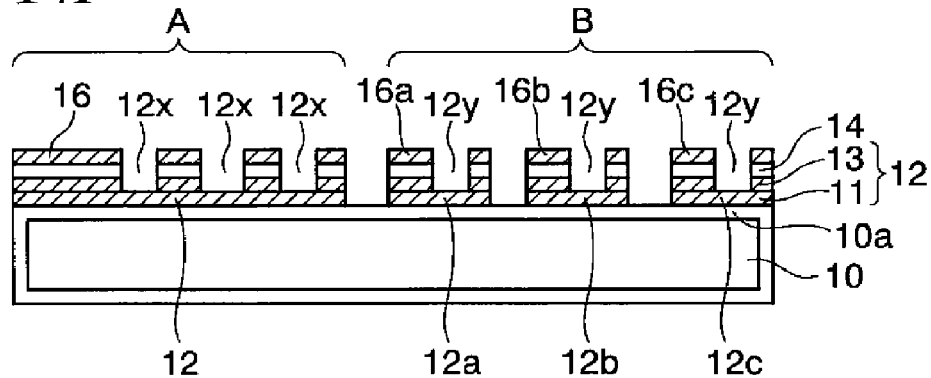

Then, as shown in FIG. 14I, the upper electrode 16 and the upper partial electrodes 16a to 16c are formed on the dielectric layer 14 by the patterning method using the semi-additive process, for example. In the multi-terminal area A, the upper electrodes 16 are formed to correspond to the lower electrodes 12 in a state that the opening portions are provided on the opening portions 14x. Also, in the electrode division area B, the upper partial electrodes 16a to 16c are formed to be divided to correspond to the lower partial electrodes 12a to 12c respectively and also the opening portions are provided on the opening portions 12y.

Explaining in detail, first a seed layer (not shown) made of a Cr layer/Cu layer is formed on an upper surface of a resultant structure in FIG. 14H by the sputter method, and then a resist film (not shown) in which opening portions are provided in portions in which the upper electrode and the upper partial electrodes are to be formed is formed. Then, metal layer patterns (not shown) made of Cu, or the like are formed in the opening portions in the resist film by the electroplating utilizing the seed layer as the plating power-feeding layer. Then, the resist film is removed, and then the upper electrode 16 and the upper partial electrodes 16a to 16c are obtained by etching the seed layer while using the metal layer patterns as a mask. In this case, various metal materials similar to the lower electrode 12 may be used as the upper electrode 16.

Accordingly, by the previously formed opening portions 14x, 14y (FIG. 14H) and the opening portions of the upper electrode 16 and the upper partial electrodes 16a to 16c, in the multi-terminal area A, a plurality of opening portions 12x from which the connection portions of the conductive layer 11 of the lower electrode 12 are exposed is formed, and in the electrode division area B, the opening portions 12y from which the connection portions of the conductive layer 11 of a plurality of lower partial electrodes 12a to 12c are exposed respectively is formed.

Figure 14J:
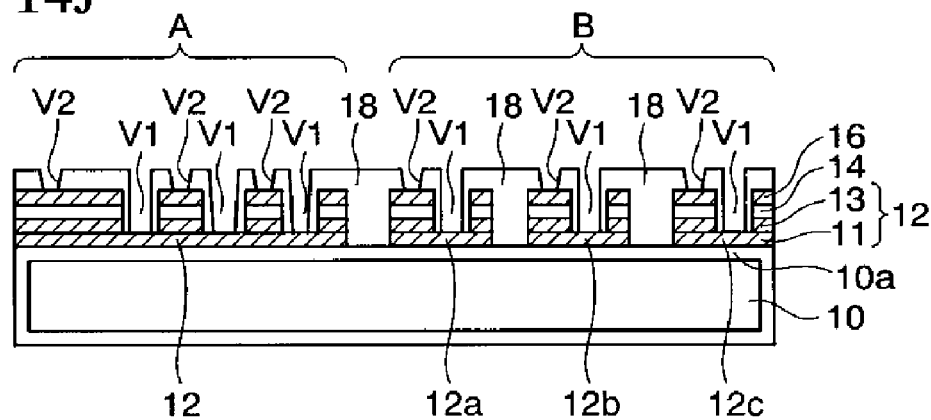

Then, as shown in FIG. 14J, the first insulating layer 18 in which opening portions are provided on the bottom portions of the opening portions 12x, 12y and the connection portions of the upper electrode 16 and the upper partial electrodes 16a to 16c is patterned. Accordingly, the lower electrode connecting vias V1, from which the connection portions of the lower electrode 12 and the lower partial electrodes 12a to 12c are exposed respectively, and the upper electrode connecting vias V2, from which the connection portions of the upper electrode 16 and the upper partial electrodes 16a to 16c are exposed respectively, are formed. A side surface of the lower electrode connecting via V1 is covered with the first insulating layer 18, and a wiring layer formed later in the lower electrode connecting via V1 and the upper electrode 16 and the upper partial electrodes 16a to 16c are insulated electrically.

As a method of forming the first insulating layer 18, there is a method of forming an insulating film or a coating layer made of a photosensitive epoxy resin, polyimide resin, or the like on the upper surface side of a resultant structure in FIG. 14I and then patterning the insulating film or the coating layer by means of the photolithography. Otherwise, when a non-photosensitive insulating film or coating layer is used, such film or layer may be patterned by the laser or the dry etching.

Figure 14K:
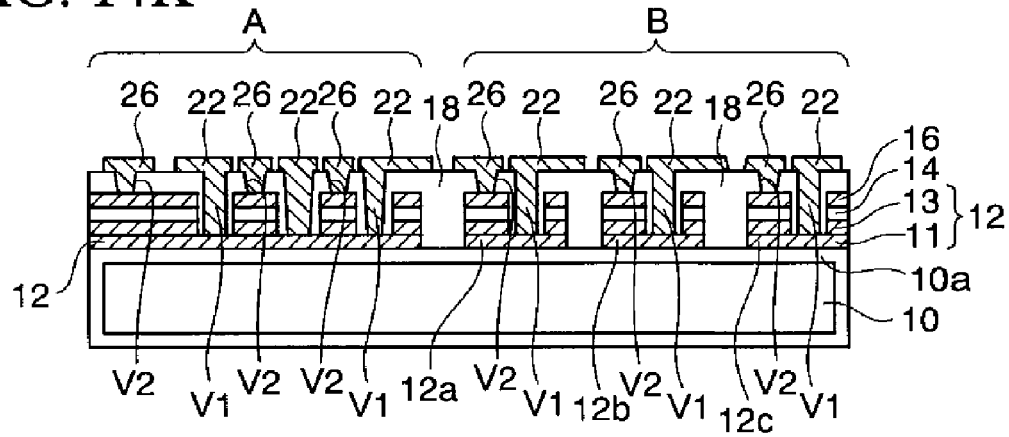
Figure 14L:
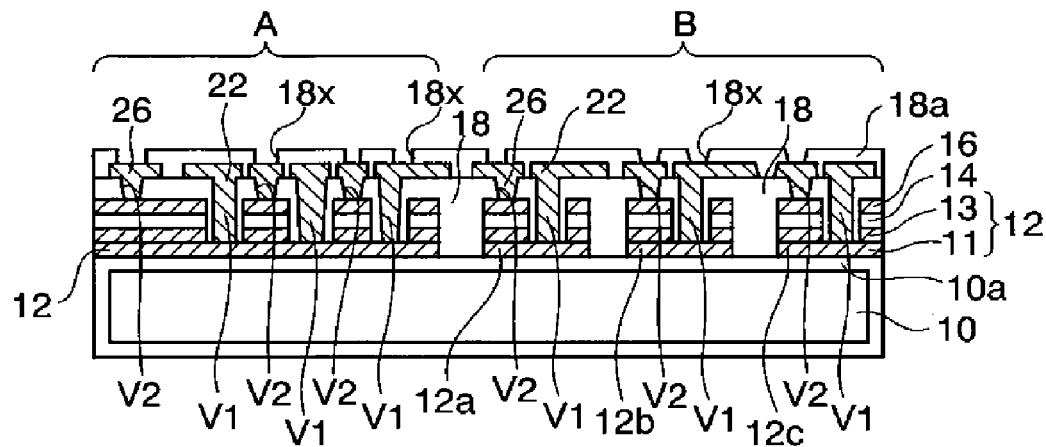

Then, as shown in FIG. 14K, the first lower electrode rewiring layer 22 connected to the lower electrode 12 and the lower partial electrodes 12a to 12c respectively and the first upper electrode rewiring layers 26 connected to respective upper electrodes 16 and the upper partial electrodes 16a to 16c are formed on the first insulating layer 18 by the above semi-additive process, or the like. The first lower electrode rewiring layer 22 is formed as the common electrode that is connected to the lower electrode 12 and the lower partial electrodes 12a to 12c via a plurality of lower electrode connecting vias V1. Also, the first upper electrode rewiring layers 26 are connected individually to the upper electrodes 16 and the upper partial electrodes 16a to 16c via the upper electrode connecting vias V2 respectively Then, as shown in FIG. 14L, the second insulating layer 18a in which the via holes 18x are provided on the first upper electrode rewiring layer 26 and the first lower electrode rewiring layer 22 is formed.

Figure 14M:
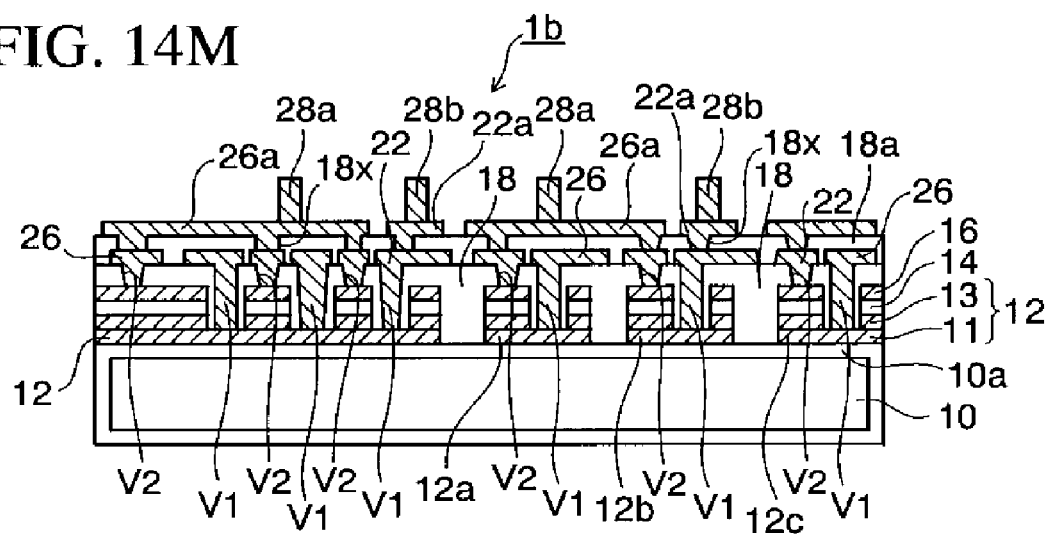

Then, as shown in FIG. 14M, the second upper electrode rewiring layer 26a which is connected to the first upper electrode rewiring layer 26, and second lower electrode rewiring layers 22a which are connected to the first lower electrode rewiring layer 22, via the opening portion 18x in the second insulating layer 18a, are formed on the second insulating layer 18a by the semi-additive process, or the like. The first upper electrode rewiring layer 26 connected independently to the upper electrodes 16 and the upper partial electrodes 16a to 16c is connected to the second-layer second upper electrode rewiring layer 26a acting as the common electrode.

Also, the first lower electrode rewiring layer 22 connected to the lower electrodes 12 and the lower partial electrodes 12a to 12c to act as the common electrode is connected to the second lower electrode rewiring layer 22a as second-layer.

Then, the upper electrode external connection terminal 28a and the lower electrode external connection terminal 28b are provided to the second upper electrode rewiring layer 26a and the second lower electrode rewiring layers 22a respectively.

With the above, a third capacitor parts 1b of the present embodiment is obtained. In the third capacitor parts 1b, the upper electrode and the lower electrode of the capacitor elements, in which the multiple terminals are provided, and the capacitor elements, in which the electrode division is applied, are connected to the rewiring layer as the common electrode respectively and thus connected electrically in parallel.

In this case, the method of forming a plurality of capacitor elements, in which the multiple terminals are provided, and a plurality of capacitor elements, in which the electrode division is applied, are formed simultaneously on the substrate 10 and then connecting them in parallel is explained. But the above first and second capacitor parts 1, 1a constructed only by the multiple terminal type or the electrode division type can also be manufactured by the similar method.

In particular, in case the silicon wafer is employed as the substrate, the so-called wafer process using the high photolithography technology can be employed. Therefore, even when a large number of fine connecting vias (electrode terminals) are formed or the electrode is divided into a large number of fine electrodes, parallel circuits having the small inductance can be formed easily by using the fine rewiring layer.

Next, a method of mounting the capacitor parts of the present embodiment onto the circuit substrate will be explained hereunder. FIGS. 15A to 15G are sectional views showing a method of mounting the capacitor parts of the embodiment of the present invention onto the circuit substrate. In this case, since the capacitor parts 1b is identical to the third capacitor parts 1b in FIG. 14M, the reference symbols other than the external connecting terminals 28a, 28b will be omitted herein.

Figure 15A:
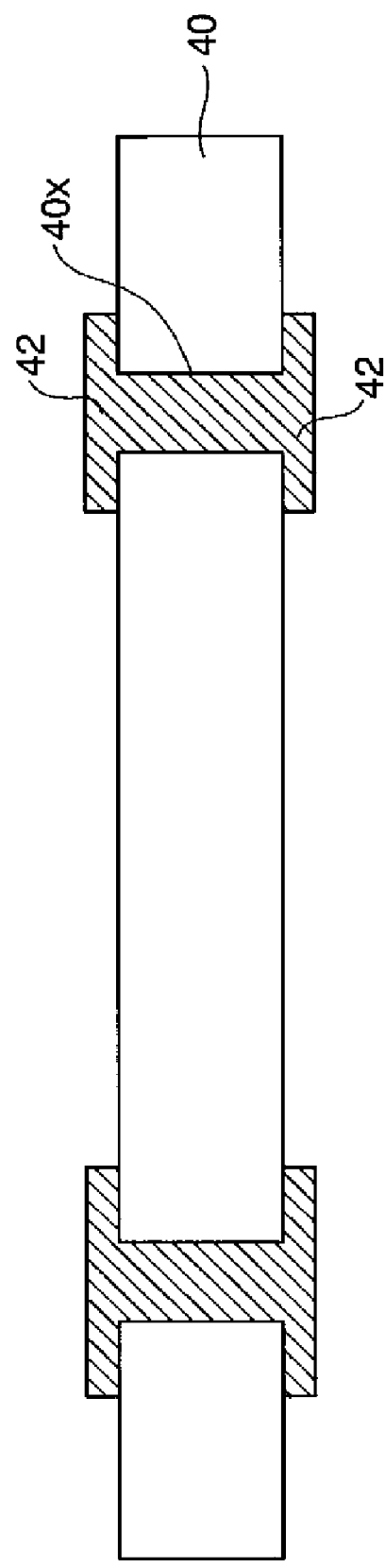

As shown in FIG. 15A, first a core substrate 40 made of insulating material such as a glass epoxy resin, or the like is prepared. Through holes 40x are provided in this core substrate 40, and first wiring layers 42 connected mutually via the through hole 40x are formed on both surface sides of the core substrate 40.

Figure 15B:
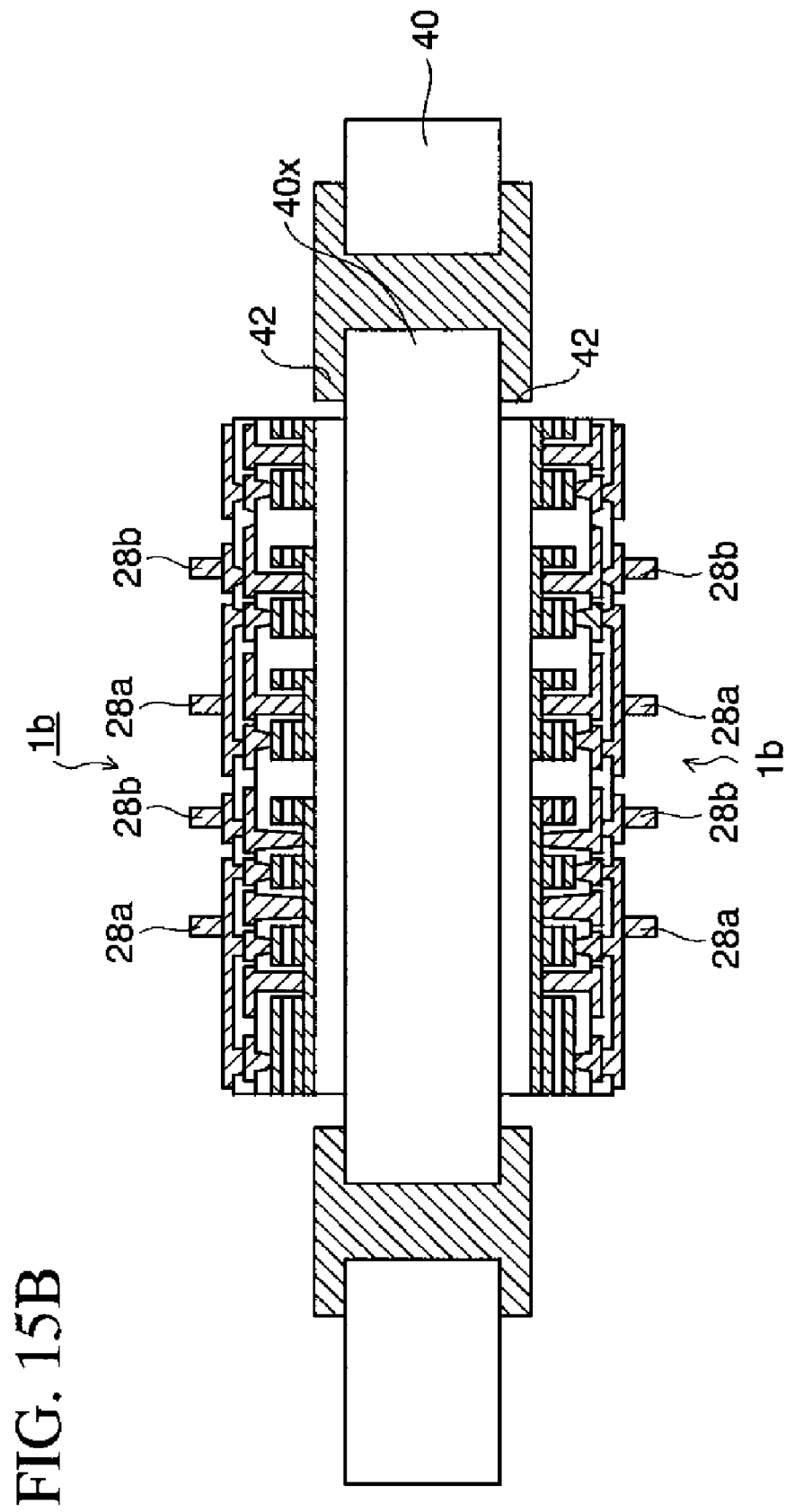
Figure 15C:
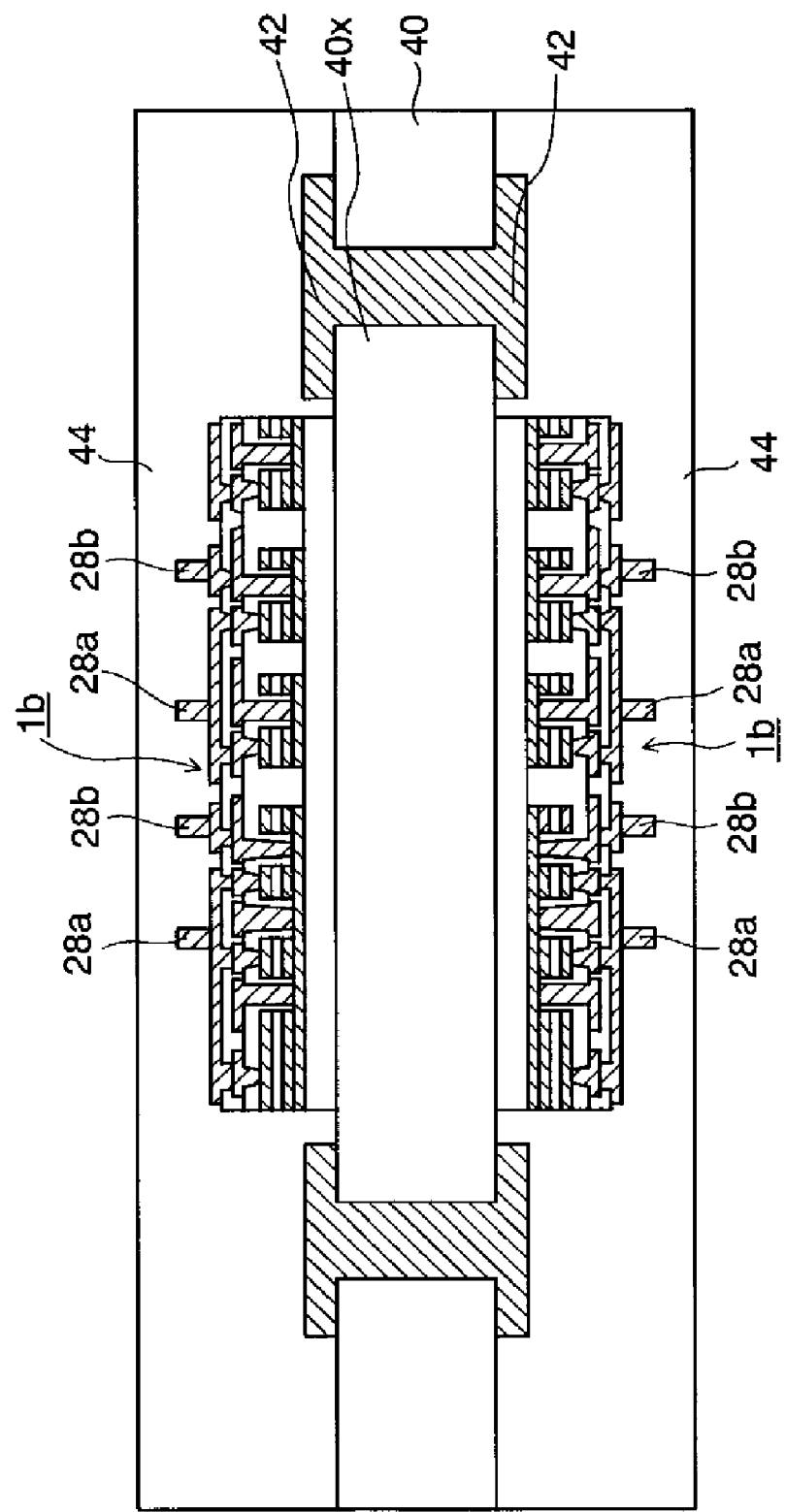

Then, as shown in FIG. 15B, the capacitor parts 1b of the present embodiment is adhered onto the core substrate 40 by an adhesive layer (not shown) to direct the external connecting terminals 28a, 28b of the capacitor parts 1b upwardly (face-up). In the present embodiment, the capacitor parts 1b is mounted onto both surface sides of the core substrate 40. Then, as shown in FIG. 15C, a resin film is pasted on both surface sides of the core substrate 40 respectively and then pressurized (heat press)in a vacuum atmosphere (or a low-pressure atmosphere) while heating at a temperature of 150 to 200° C. Thus, a first insulating layer 44 is formed to cover the capacitor parts 1b on both surface sides of the core substrate 40 respectively. As one preferable example of the material of the first insulating layer 44, the epoxy resin containing fillers whose particle size is 1 to 5 μm is employed. Since such first insulating layer 44 has a thermal expansion coefficient of 50 ppm/° C. or less that approximates a thermal expansion coefficient (3 ppm/° C.) of the substrate 10 (silicon) of the capacitor parts 1b, a bowing of the circuit substrate generated due to thermal stress can be prevented. Also, a film thickness of the first insulating layer 44 is set to about 150 μm, for example, when a thickness of the capacitor parts 1b is about 150 μm.

Figure 15D:
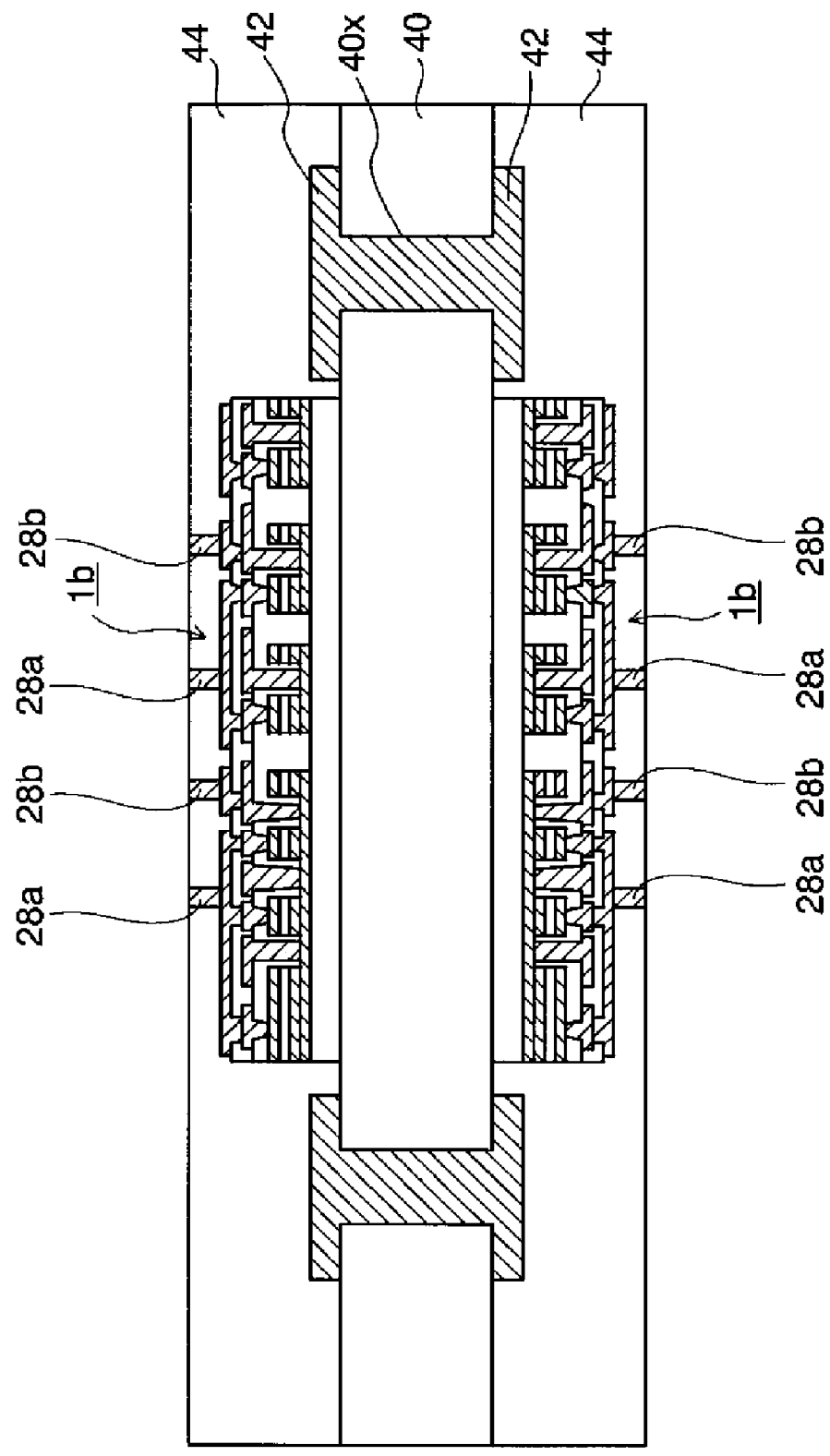

Then, as shown in FIG. 15D, the first insulating layers 44 on both surface sides of the core substrate 40 are polished respectively until top end portions of the external connecting terminals 28a, 28b of the capacitor parts 1b are exposed. Then, as shown in FIG. 15E, the first insulating layers 44 on both surface sides of the core substrate 40 are processed by the laser, or the like respectively. Thus, first via holes 44x having a depth that reaches the first wiring layer 42 on both surface sides of the core substrate 40 are formed respectively.

Also, as shown in FIG. 15E similarly, second wiring layers 42a connected to the top end portions of the external connecting terminals 28a, 28b of the capacitor parts 1b are formed on both surface sides of the core substrate 40 by the semi-additive process, or the like respectively. The second wiring layer 42a is also connected to the first wiring layer 42 via the first via hole 44x.

Figure 15F:
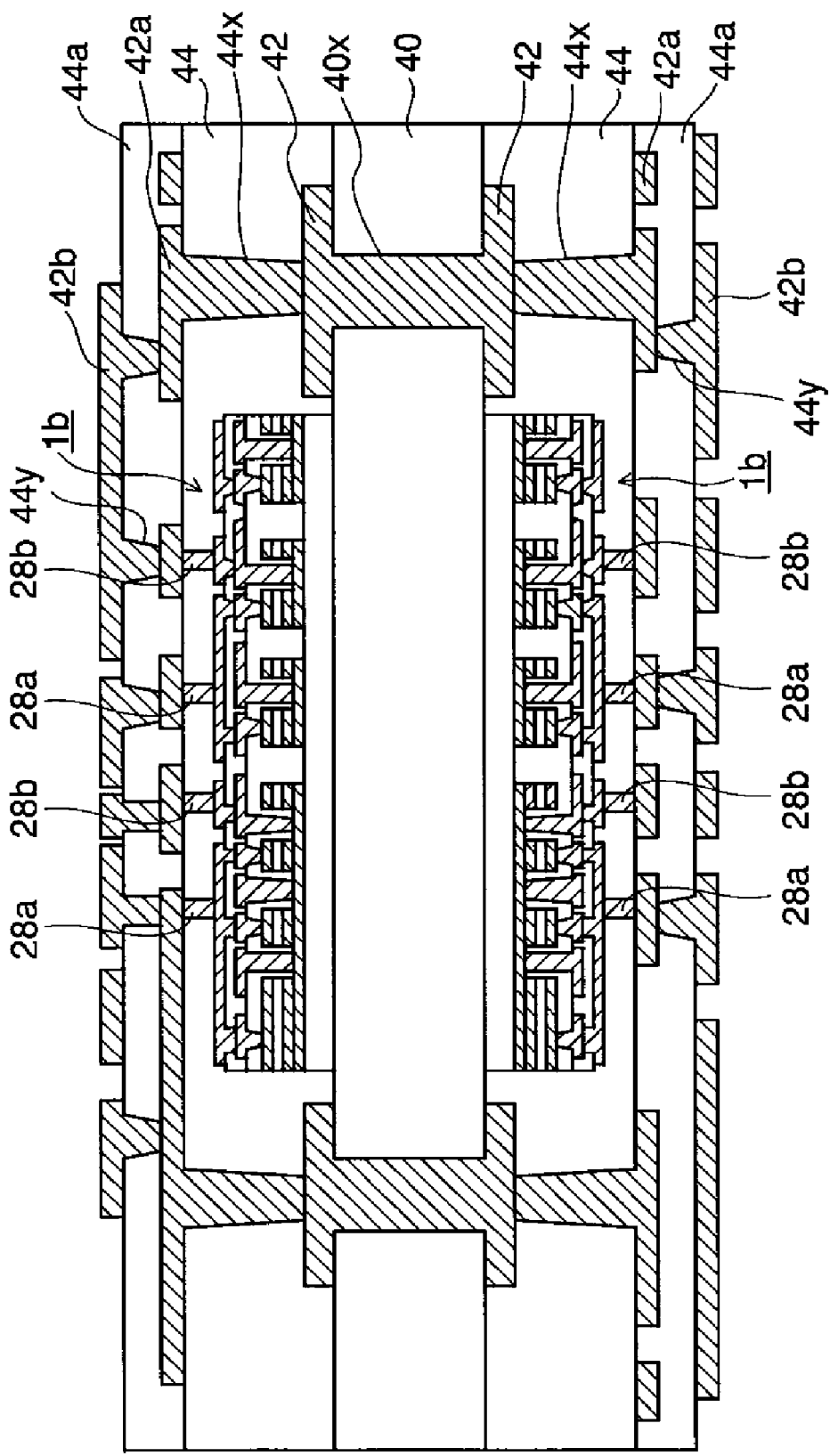
Figure 15G:
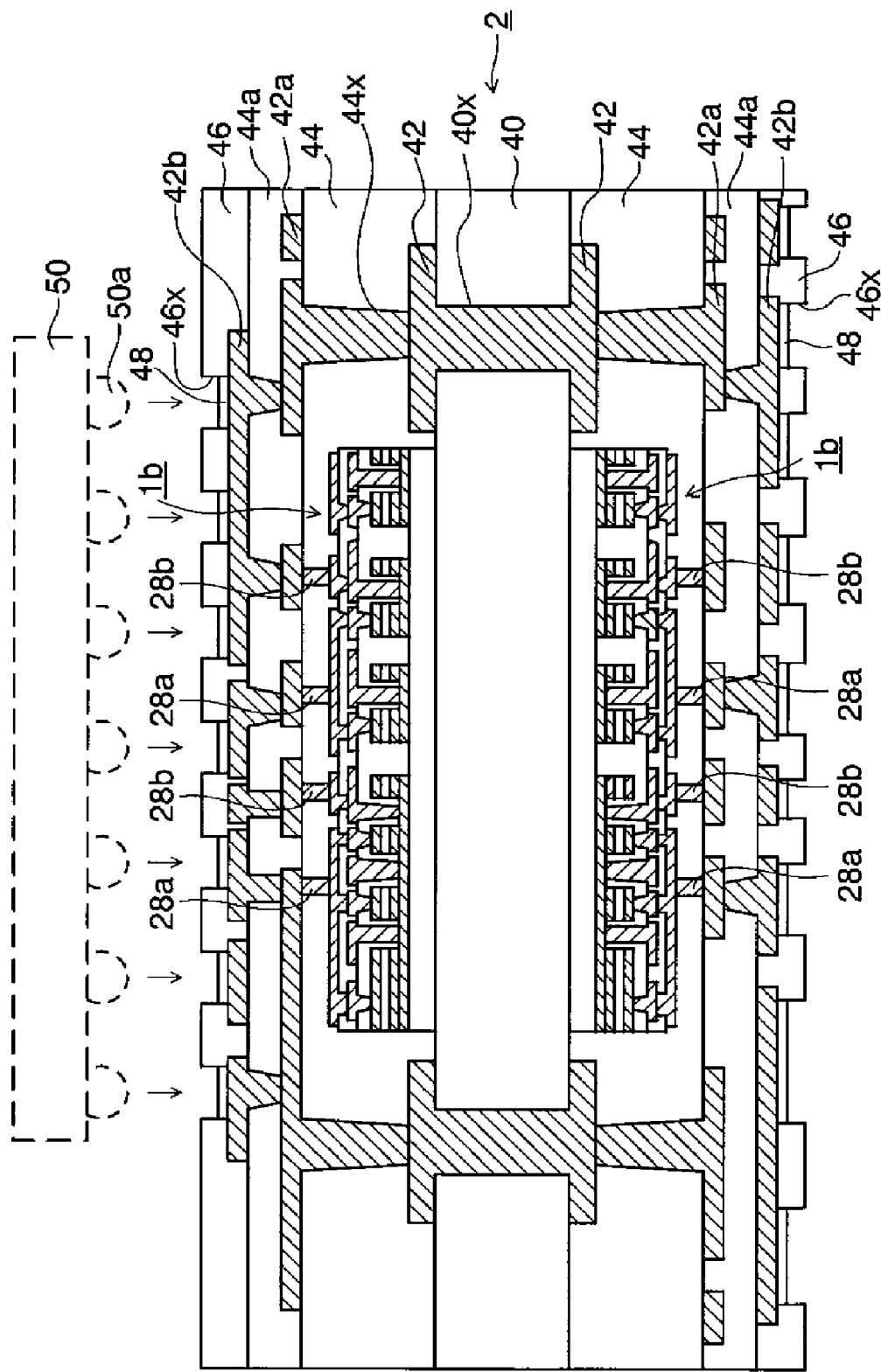

Then, as shown in FIG. 15F, a second insulating layer 44a in which second via holes 44y are provided on the second wiring layers 42a is formed on both surface sides of the core substrate 40 respectively. Then, third wiring layers 42b connected to the second wiring layers 42a via the second via holes 44y are formed on the second insulating layer 44a on both surface sides of the core substrate 40 respectively. Then, as shown in FIG. 15G, a solder resist film 46 in which opening portions 46x are provided on the connection portions of the third wiring layers 42b is formed on both surface sides of the core substrate 40 respectively. Then, connection portions 48 are obtained by forming a Ni/Au plating layer on the third wiring layers 42b in the opening portions 46x.

With the above, a circuit substrate 2 in which the capacitor parts 1b of the present embodiment is mounted on both surface sides of the core substrate 40 in a condition that such capacitor parts 1b is buried in the insulating layer 44 is obtained. A semiconductor chip 50 is connected electrically to the upper or lower connection portions 48 of the circuit substrate 2 via bumps 50a. Then, the capacitor parts 1b of the present embodiment is connected between the power-supply line and the ground line of the semiconductor chip 50 in the circuit substrate 2 and acts as the decoupling capacitor.

Normally, in the step of manufacturing the circuit substrate, it is difficult to apply the high photolithography technology used in the wafer process. Therefore, unlike the present embodiment, it is extremely difficult to connect in parallel a plurality of capacitor elements, in which the multiple terminals are provided or the electrode division is applied, by using the fine rewiring layer in the steps of manufacturing the circuit substrate.

However, in the present embodiment, the parallel circuits having the small inductance can be constructed on the substrate 10 (silicon wafer) of the capacitor parts 1b by connecting in parallel a plurality of capacitor elements, each having the slightly different impedance, by means of the fine rewiring layer that is obtained by the high photolithography technology. Accordingly, the decoupling capacitor whose impedance is kept low in the wide high-frequency band (GHz band) can be easily built in the circuit substrate 2.

Further, there is no need to connect in parallel the capacitor elements of the capacitor parts 1b on the circuit substrate 2, and the capacitor parts 1b is arranged just under the semiconductor chip 50. Therefore, the semiconductor chip 50 and the capacitor parts 1b can be connected by the relatively simple wiring layer at a shortest wiring distance. As a result, the overall inductance of the circuit substrate 2 can be reduced, and the capacitor parts of the present embodiment can give enough performance as the decoupling capacitor for the semiconductor chip operated at a high speed.

What is claimed is:

1. Capacitor parts, comprising:
    a substrate;
    a plurality of capacitor elements arranged on the substrate, and composed of a lower electrode, a dielectric layer, and an upper electrode respectively;
    a lower electrode rewiring layer formed over said plurality of capacitor elements, and connected electrically to lower electrodes of said plurality of capacitor elements respectively to act as a common electrode; and
    an upper electrode rewiring layer formed over said plurality of capacitor elements, and connected electrically to upper electrodes of said plurality of capacitor elements respectively to act as another common electrode;
    wherein said plurality of capacitor elements are connected elecirically in parallel in a state of the capacitor parts, and said plurality of capacitor elements have a different impedance in them.

2. Capacitor parts according to claim 1, further comprising:
    a lower electrode connecting via constructed by covering an insulating layer on a side surface of an opening portion that is provided in the upper electrode and the dielectric layer, and having a depth that reaches the lower electrode;
    the insulating layer formed to extend from a side surface of the lower electrode connecting via to an upper area of the upper electrode; and
    an upper electrode connecting via formed in a portion of the insulating layer on a connection portion of the upper electrode;
    wherein the lower electrode rewiring layer is connected to the lower electrode via the lower electrode connecting via, and to upper electrode rewiring layer is connected to the upper electrode via the upper electrode connecting via.

3. Capacitor parts according to claim 2, wherein a number of the lower electrode connecting via and the upper electrode connecting via is different in said plurality of capacitor elements, and the lower electrode connecting via and the upper electrode connecting via are aligned such that electric polarities are ranged alternately.

4. Capacitor parts according to claim 2, wherein the lower electrode rewiring layer is composed of
    a first lower electrode rewiring layer formed on the insulating layer, and connected to the respective lower electrodes of said plurality of capacitor elements via the lower electrode connecting via to act as a common electrode, and
    a second lower electrode rewiring layer formed over the first lower electrode rewiring layer as a second-layer wiring, and
    the upper electrode rewiring layer is composed of
    a first upper electrode rewiring layer formed on the insulating layer, and connected to the respective upper electrodes of said plurality of capacitor elements via the upper electrode connecting via, and
    a second upper electrode rewiring layer formed over the first upper electrode rewiring layer as the second-layer wiring to act as a common electrode of the respective upper electrodes.

5. Capacitor parts according to claim 4, wherein an external connecting terminal is provided to the second lower electrode rewiring layer and the second upper electrode rewiring layer respectively to protrude.

6. Capacitor parts according to claim 1, wherein, the capacitor elements that the lower electrode and the upper electrode are divided to partial electrodes such that electric polarities are assigned to arrange alternately are contained in said plurality of the capacitor elements, and a number of division of the partial electrodes is different in said plurality of capacitor elements.

7. Capacitor parts according to claim 1, wherein the dielectric layer is formed of a metal oxide layer selected from a group consisting of BST, STO, PZT, BTO, AlOx, SiOx, NbOx, TiOx and TaOx, or a resin layer containing fillers of the metal oxide layer.

8. Capacitor parts according to claim 1, wherein the lower electrode and the upper electrode are formed of a single-layer metal film or a stacked metal film made of a material selected from a group consisting of copper (Cu), tantalum (Ta), chromium (Cr), platinum (Pt), gold (Au), tungsten (W), ruthenium (Ru), and nickel (Ni).

9. Capacitor parts according to claim 1, wherein the capacitor parts is built in a circuit substrate onto which a semiconductor chip is mounted, and acts as a decoupling capacitor.

10. Capacitor parts according to claim 1, wherein the capacitor parts is mounted onto a circuit substrate in a condition that the capacitor parts is buried in the insulating layer to direct the external connecting terminal upwardly, and a wiring layer of the circuit substrate is connected electrically to a top end portion of the external connecting terminal.

* * * * *